(12) United States Patent
Scalora

(10) Patent No.: US 6,396,617 B1
(45) Date of Patent: May 28, 2002

(54) PHOTONIC BAND GAP DEVICE AND METHOD USING A PERIODICITY DEFECT REGION DOPED WITH A GAIN MEDIUM TO INCREASE PHOTONIC SIGNAL DELAY

(76) Inventor: Michael Scalora, 15037 Ashmont Cir., Huntsville, AL (US) 35803

(*) Notice: Subject to any disclaimer, the term of this patent is extended or adjusted under 35 U.S.C. 154(b) by 0 days.

(21) Appl. No.: 09/572,290

(22) Filed: May 17, 2000

Related U.S. Application Data

(60) Provisional application No. 60/134,536, filed on May 17, 1999.

(51) Int. Cl.$^7$ ................................................. G02B 1/10

(52) U.S. Cl. ...................... 359/248; 359/279; 359/331; 359/586; 359/587; 359/588; 385/5; 385/14; 385/122

(58) Field of Search ................................ 359/140, 248, 359/250, 259, 260, 264, 279, 321, 331; 586–589; 385/5, 14, 122

(56) References Cited

U.S. PATENT DOCUMENTS

| | | | |
|---|---|---|---|
| 3,410,625 A | 11/1968 | Edwards | 359/359 |
| 3,637,294 A | 1/1972 | Berthold, III | 359/582 |
| 3,682,528 A | 8/1972 | Apfel et al. | 359/360 |
| 3,697,153 A | 10/1972 | Zycha | 359/288 |
| 3,698,946 A | 10/1972 | Kaspaul et al. | 428/432 |
| 3,706,485 A | 12/1972 | Fawcett et al. | 359/588 |
| 3,759,604 A | 9/1973 | Thelan | 359/588 |
| 3,853,386 A | 12/1974 | Ritter et al. | 359/588 |
| 3,885,855 A | 5/1975 | Gross | 359/360 |
| 3,889,026 A | 6/1975 | Groth | 428/34 |
| 3,901,997 A | 8/1975 | Groth | 428/428 |
| 3,914,023 A | 10/1975 | Thelen | 359/588 |
| 3,978,273 A | 8/1976 | Groth | 428/434 |

(List continued on next page.)

FOREIGN PATENT DOCUMENTS

| | | |
|---|---|---|
| EP | 0 012 439 A1 | 12/1979 |
| EP | 0 782 017 A2 | 7/1997 |

(List continued on next page.)

OTHER PUBLICATIONS

Ashcroft, Neil W. and Mermin, N. David, *Solid State Physics*, Holt, Rinehart and Winston, 1976, pp. xi–xiii and 765 and 766.

(List continued on next page.)

*Primary Examiner*—Georgia Epps
*Assistant Examiner*—Evelyn A. Lester
(74) *Attorney, Agent, or Firm*—Sterne, Kessler, Goldstein & Fox P.L.L.C.

(57) ABSTRACT

A photonic band gap structure device and method for delaying photonic signals of a predetermined frequency and a predetermined bandwidth by a predetermined delay is provided. A Fabry-Perot delay line device has several regions of periodically alternating refractive material layers which exhibit a series of photonic band gaps and a periodicity defect region, interposed between the regions of periodically alternating refractive material layers. The Fabry-Perot delay line device imparts a predetermined delay to photonic signals that pass therethrough. The introduction of the periodicity defect region into this photonic band gap structure creates a sharp transmission resonance within the corresponding photonic band gap of the structure and causes at least an order of magnitude improvement in photonic signal delay for a band-edge delay line device of similar size. Variable photonic delays to multiple photonic signals are also generated by this Fabry-Perot delay line device. In addition, a photonic signal delay device based on an optical fiber grating structure is provided. A defect layer doped with a gain medium increases the density of modes thereby increasing the density of photons at a particular frequency. The introduction of gain automatically causes an increase in the photon density, and therefore, a narrowing of the density of modes. This allows tuning of the group velocity, just as if periods were being added. This also enables larger delays.

6 Claims, 18 Drawing Sheets

U.S. PATENT DOCUMENTS

| | | | | |
|---|---|---|---|---|
| 4,179,181 | A | 12/1979 | Chang | 359/360 |
| 4,189,205 | A | 2/1980 | Vandehei | 359/360 |
| 4,229,066 | A | 10/1980 | Rancourt et al. | 359/359 |
| 4,240,696 | A | 12/1980 | Tracey et al. | 359/548 |
| 4,269,481 | A | 5/1981 | Yeh et al. | 359/259 |
| 4,441,789 | A | 4/1984 | Pohlack | 359/588 |
| 4,488,775 | A | 12/1984 | Yamamoto | 359/588 |
| 4,525,687 | A | 6/1985 | Chemla et al. | 359/276 |
| 4,556,277 | A | 12/1985 | Fan et al. | 359/360 |
| 4,590,118 | A | 5/1986 | Yatabe | 428/215 |
| H182 | H | 1/1987 | Heller | 340/686.3 |
| 4,726,655 | A | 2/1988 | Mahlein | 359/588 |
| 4,756,602 | A | 7/1988 | Southwell et al. | 359/288 |
| 4,770,496 | A | 9/1988 | Mahlein | 359/588 |
| 4,773,717 | A | 9/1988 | Pai et al. | 359/589 |
| 4,838,648 | A | 6/1989 | Phillips et al. | 359/585 |
| 4,846,551 | A | 7/1989 | Rancourt et al. | 359/589 |
| 4,915,494 | A | 4/1990 | Shipley et al. | 359/848 |
| 5,035,485 | A | 7/1991 | Kageyama | 359/586 |
| 5,071,206 | A | 12/1991 | Hood et al. | 359/360 |
| 5,111,329 | A | 5/1992 | Gajewski et al. | 359/275 |
| 5,119,232 | A | 6/1992 | Daley et al. | 359/359 |
| 5,148,504 | A | 9/1992 | Levi et al. | 385/14 |
| 5,170,290 | A | 12/1992 | Land et al. | 359/579 |
| 5,179,468 | A | 1/1993 | Gaslolo | 359/359 |
| 5,187,461 | A | 2/1993 | Brommer et al. | 333/219.1 |
| 5,212,584 | A | 5/1993 | Chung | 359/260 |
| 5,225,930 | A | 7/1993 | Land et al. | 359/578 |
| 5,233,464 | A | 8/1993 | Costich | 359/359 |
| 5,239,406 | A | 8/1993 | Lynam | 359/275 |
| 5,247,528 | A | 9/1993 | Shinozaki et al. | 372/22 |
| 5,262,894 | A | 11/1993 | Wheatley et al. | 359/586 |
| 5,268,785 | A | 12/1993 | Crenshaw et al. | 359/244 |
| 5,313,437 | A | 5/1994 | Alfano et al. | 359/588 |
| 5,315,430 | A | 5/1994 | Brennan et al. | 359/248 |
| 5,337,183 | A | 8/1994 | Rosenblatt | 359/248 |
| 5,345,328 | A | 9/1994 | Fritz et al. | 359/248 |
| 5,355,245 | A | 10/1994 | Lynam | 359/267 |
| 5,372,874 | A | 12/1994 | Dickey et al. | 428/216 |
| 5,406,573 | A | 4/1995 | Ozbay et al. | 372/43 |
| 5,424,559 | A | 6/1995 | Kasahara | 257/21 |
| 5,433,988 | A | 7/1995 | Fukuda et al. | 428/141 |
| 5,440,421 | A | 8/1995 | Fan et al. | 359/344 |
| 5,448,404 | A | 9/1995 | Schrenk et al. | 359/584 |
| 5,457,570 | A | 10/1995 | Lu et al. | 359/361 |
| 5,471,180 | A | 11/1995 | Brommer et al. | 333/202 |
| 5,480,722 | A | 1/1996 | Tomonaga et al. | 428/428 |
| 5,493,442 | A | 2/1996 | Buchholz et al. | 359/359 |
| 5,506,037 | A | 4/1996 | Termath | 428/216 |
| 5,506,919 | A | 4/1996 | Roberts | 385/1 |
| 5,513,039 | A | 4/1996 | Lu et al. | 359/584 |
| 5,514,476 | A | 5/1996 | Hartig et al. | 428/426 |
| 5,552,882 | A | 9/1996 | Lyons et al. | 356/73.1 |
| 5,557,462 | A | 9/1996 | Hartig et al. | 359/585 |
| 5,559,825 | A | 9/1996 | Scalora et al. | 372/96 |
| 5,563,734 | A | 10/1996 | Wolfe et al. | 359/360 |
| 5,591,529 | A | 1/1997 | Braatz et al. | 428/457 |
| 5,595,825 | A | 1/1997 | Guiselin | 428/428 |
| 5,615,289 | A | 3/1997 | Duck et al. | 385/24 |
| 5,740,287 | A | 4/1998 | Scalora et al. | 385/6 |
| 5,751,466 | A | 5/1998 | Dowling et al. | 359/248 |
| 5,796,902 | A | 8/1998 | Bhat et al. | 385/122 |
| 5,801,378 | A | 9/1998 | Hane et al. | 250/237 G |
| 5,907,427 | A | 5/1999 | Scalora et al. | 359/248 |
| 5,909,035 | A | 6/1999 | Kim | 257/59 |
| 5,943,155 | A | 8/1999 | Goossen | 359/247 |
| 5,949,571 | A | 9/1999 | Goossen et al. | 359/291 |
| 6,028,693 | A | 2/2000 | Fork et al. | 359/248 |
| 6,262,830 | B1 * | 7/2001 | Scalora | 257/451 |
| 6,304,366 | B1 * | 10/2001 | Scalora et al. | 359/328 |

FOREIGN PATENT DOCUMENTS

| | | | |
|---|---|---|---|
| EP | 0 782 017 A3 | 8/1998 | |
| GB | 1406940 | 9/1975 | |
| JP | 59-151108 | 8/1984 | |
| JP | 64-80908 | 3/1989 | G02B/5/28 |
| JP | 2-187732 | 7/1990 | G02F/1/23 |
| WO | WO 96/11516 | 4/1996 | H01S/3/085 |

OTHER PUBLICATIONS

Assanto, Gaetano, "Quadratic Cascading: Effects and Applications," *Beam Shaping and Control with Nonlinear Optics*, (ed. By Kajzar and Reinisch), Plenum Press, 1998, pp. vii–viii and 341–374.

Ball, G. A. and Morey, W.W., "Continuously tunable single–mode erbium fiber laser," *Optics Letters*, Optical Society of America, vol. 17, No. 6, Mar. 15, 1992, pp. 420–422.

Bendickson, J.M. et al., "Analytic expressions for the electromagnetic mode density in finite, one–dimensional, photonic band–gap structures," *Physical Review E*, The American Physical Society, vol. 53, No. 4–B, Apr. 1996, pp. 4107–4121.

Bloemer, M.J. and Scalora, M., "Transmissive properties of AG/MgF$_2$ photonic band gaps," *Applied Physics Letters*, American Institute of Physics, vol. 72, No. 14, Apr. 6, 1998, pp. 1676–1678.

Bouché, N. et al., "Dynamics of gain in vertical cavity lasers and amplifiers at 1.53 $\mu$m using femtosecond photoexcitation," *Applied Physics Letters*, American Institute of Physics, vol. 73, No. 19, Nov. 9, 1998, pp. 2718–2720.

Centini, M. et al., "Dispersive properties of finite, one–dimensional photonic band gap structures: Applications to nonlinear quadratic interactions," *Physical Review E*, The American Physical Society, vol. 60, No. 4–B, oct. 1999, pp. 4891–4898.

Cojocaru, C. et al., "Active reflection via a phase–insensitive quadratic nonlinear interaction within a microcavity," *Applied Physics Letters*, American Institute of Physics, vol. 74, No. 4, Jan. 25, 1999, pp. 504–506.

D'Aguanno, G.D. et al., "Enhancement of $\chi^{(2)}$ cascading processes in one–dimensional photonic bandgap structures," *Optics Letters*, Optical Society of America, vol. 24, No. 23, Dec. 1, 1999, pp. 1663–1665.

DeSalvo, R. et al., "Self–focusing and self–defocusing by cascaded second–order effects in KTP," *Optics Letters*, Optical Society of America, vol. 17, No. 1, Jan. 1, 1992, pp. 28–30.

Dialog File 348 (European Patents) English Language Patent Abstract for EP 0 012 439 A1, published Jun. 25, 1990, p. 1.

Dialog File 347 (JPO & JAPIO) English Language Patent Abstract for JP 59–151108, published Aug. 29, 1984, p. 1.

Dowling, J.P. et al., "The photonic band edge laser: A new approach to gain enhancement," *Journal of Applied Physics*, American Institute of Physics, vol. 75, No. 4, Feb. 15, 1994, pp. 1896–1899.

Fowles, Grant R., *Introduction to Modern Optics*, Second Edition, 1975, Holt, Rhinehart and Winston, pp. v–viii, 33–38, 52–55 and 96–103.

Grétillat, M.–A. et al., "Electrostatic Polysilicon Microrelays Integrated with MOSFETs," *Proceedings Of Micro Electro Mechanical Systems*, IEEE, Jan. 25–28, 1994, pp. 97–101.

Haus, J.W. et al., "Enhanced second–harmonic generation in media with a weak periodicity," *Physical Review A,* The American Physical Society, vol. 57, No. 3, Mar. 1988, pp. 2120–2128.

"Indicators and displays," *Machine Design: 1988 Reference Issue Series,* Penton Publishing Inc., May 19, 1988, pp. 190–200.

Joannopoulos, John D. et al., *Photonic Crystals: Modling the Flow of Light,* 1995, Princeton University Press, (copy of entire book provided).

Lewis, C.F., "Optical Coatings: More Than Meets the Eye," *Materials Engineering,* Penton Publishing, Inc., Nov. 1989, pp. 29–32.

Macleod, H.A., *Thin–Film Optical Filters,* Second Edition, 1986, Macmillan Publishing Company, (copy of entire book provided).

Marion, Jerry B., *Classical Electromagnetic Radiation,* 1965, Academic Press, Inc., pp. ix–xv, 148–152, 170–177.

Martorell, J. et al., "Pseudo–metal reflection at the interface between a linear and a nonlinear material," *Optics Communications,* Elsevier Science B.V., vol. 144, Nos. 1–3, Dec. 1, 1997, pp. 65–69.

Mooney, T.A., "Which Coating Process Should I Choose?," *Laser & Optronics,* Jul. 1988, pp. 39–44.

Pasachoff, Jay M. and Kutner, Marc L., *University Astronomy,* 1978, W.B. Saunders Company, pp. ix–xvii and 177–239.

Patent Abstracts of Japan, vol. 018, No. 095 (E–1509), JP 05 299751 A, published Nov. 12, 1993.

Patent Abstracts of Japan, vol. 014, No. 468 (P–1115), JP 2187732, published Jul. 23, 1990.

Patent Abstracts of Japan, vol. 008, No. 081 (E–238), JP 59 000977 A, published Jan. 6, 1984.

Petersen, K.E., "Micromechanical Membrane Switches on Silicon," *IBM J. Res. Develop.,* vol. 23, No. 4, Jul. 1979, pp. 376–385.

Rao, Y.J. et al., "Spatially–multiplexed fiber–optic Bragg grating strain and temperature sensor system based on interferometric wavelength–shift detection," *Electronics Letters,* The Institution of Electrical Engineers, vol. 31, No. 12, Jun. 8, 1995, pp. 1009–1010.

Scalora, M. and Crenshaw, M.E., "A beam propagation method that handles reflections," *Optics Communications,* Elsevier Science B.V., vol. 108, Nos. 4–6, Jun. 1, 1994, pp. 191–196.

Scalora, M. et al., "Dipole emission rates in one–dimensional photonic band–gap materials," *Applied Physics B,* Supplement to vol. B 60, No. 2/3, 1995, Springer–Verlag, pp. S57–S61.

Scalora, M. et al., "Optical Limiting and Switching of Ultrashort Pulses in Nonlinear Photonic Band–Gap Materials," *Physical Review Letters,* The American Physical Society, vol. 73, No. 10, Sep. 5, 1994, pp. 1368–1371.

Scalora, M. et al., "The photonic band–edge optical diode," *Journal of Applied Physics,* American Institute of Physics, vol. 76, No. 4, Aug. 15, 1994, pp. 2023–2026.

Scalora, M. et al., "Pulse propagation near highly reflective surfaces: applications to photonic band–gap structures and the question of superluminal tunneling times," *Physical Review A.,* The American Physical Society, vol. 52, No. 1, Jul. 1995, pp. 726–734.

Scalora, M. et al., "Pulsed second–harmonic generation in non–linear, one–dimensional, periodic structures," *Physical Review A,* The American Physical Society, vol. 56, No. 4, Oct. 1997, pp. 3166–3174.

Scalora, M. et al., "Ultrashort pulse propagation at the photonic band edge: large tunable group delay with minimal distortion and loss," *Physical Review E,* The American Physical Society, vol. 54, No. 2, Aug. 1996, pp. R1078–R1081.

Sprung, D.W.L. et al., "Scattering by a finite periodic potential," *American Journal of Physics,* American Association of Physics Teachers, vol. 61, No. 12, Dec. 1993, pp. 1118–1124.

Sze, S.M., *Physics of Semiconductor Devices,* Second Edition, 1981, John Wiley & Sons pp. ix–xii and 681–742.

Sze, S.M., *Semiconductor Devices: Physics & Technology,* 1985, John Wiley & Sons, pp. ix–xi and 252–467.

Tocci, M.D. et al., "Thin–film nonlinear optical diode," *Applied Physics Letters,* American Institute of Physics vol. 66, No. 18, May 1, 1995, pp. 2324–2326.

Ward, A.J. et al., "Photonic dispersion surfaces," *Journal of Physics: Condensed Matter,* IOP Publishing Ltd., vol. 7, No. 10, Mar. 6, 1995, pp. 2217–2224.

Yao, J.J. et al., "A Surface Micromachined Miniature Switch for Telecommunications Applications with Signal Frequencies from DC up to 4 Ghz," Foundation for Sensor and Actuator Technology, *Transducers '95,* 1995, pp. 384–387.

Yariv, Amnon and Yeh, Pochi, *Optical Waves in Crystals: Propagation and Control of Laser Radiation,* 1984, John Wiley & Sons, pp. vii–xi and 439–447.

Akhmediev, N. et al., "Stability analysis of even and odd waves of symmetric nonlinear planar optical waveguides," *J. Opt. Soc. Am. B,* Optical Society of America, vol. 10, No. 2, Feb. 1993, pp. 230–236.

Bowden, C.M. et al., "Development and Applications of Materials Exhibiting Photonic Band Gaps," *J. Opt. Soc. Am. B,* vol. 10, No. 2, Feb. 1993, pp. 279–280.

Brown, E.R. et al., "Radiation Properties of a planar antenna on a photonic–crystal substrate," *J. Opt. Soc. Am. B,* Optical Society of America, vol. 10, No. 2, Feb. 1993, pp. 404–407.

Bullock, D.L. et al., "Photonic band structure investigation of two–dimensional Bragg reflector mirrors for semiconductor laser mode control," *J. Opt. Soc. Am. B,* Optical Society of America, vol. 10, No. 2, Feb. 1993, pp. 399–403.

Chernov, V.E. and B.A. Zon, "Depolarization of laser radiation in a nonlinear medium," *J. Opt. Soc. Am. B,* Optical Society of America, vol. 10, No. 2, Feb. 1993, pp. 210–212.

Chu, D.Y. and S.–T. Ho, "Spontaneous emission from excitons in cylindrical dielectric waveguides and the spontaneous–emission factor of microcavity ring lasers," *J. Opt. Soc. Am. B,* Optical Society of America, vol. 10, No. 2, Feb. 1993, pp. 381–390.

Crook, R.J. et al., "Long–range optical modes supported by a strongly absorbing thin organic film," *J. Opt. Soc. Am. B,* Optical Society of America, vol. 10, No. 2, Feb. 1993, pp. 237–243.

De Martini, F. et al., "Spontaneous and stimulated emission in the thresholdless microlaser," *J. Opt. Soc. Am. B,* Optical Society of America, vol. 10, No. 2, Feb. 1993, pp. 360–380.

Dowling, J.P. and C.M. Bowden, "Beat radiation from dipoles near a photonic band edge," *J. Opt. Soc. Am. B,* Optical Society of America, vol. 10, No. 2, Feb. 1993, pp. 353–355.

Dutta, B. et al., "Squeezed states, photon–number distributions, and U(1) invariance," *J. Opt. Soc. Am. B,* Optical Society of America, vol. 10, No. 2 Feb. 1993, pp. 253–264.

Erdogan, T. et al., "Enhancement and inhibition of radiation in cylindrically symmetric, periodic structures," *J. Opt. Soc. Am. B,* Optical Society of America, vol. 10, No. 2, Feb. 1993, pp. 391–398.

Gaylord, T.K. et al., "Application of electromagnetics formalism to quantum–mechanical electron–wave propagation in semiconductors," *J. Opt. Soc. Am. B,* Optical Society of America, vol. 10, No. 2, Feb. 1993, pp. 333–339.

Genack, A.Z. and N. Garcia, "Electromagnetic localization and photonics," *J. Opt. Soc. Am. B,* Optical Society of America, vol. 10, No. 2, Feb. 1993, pp. 408–413.

Helmfrid, S. et al., "Influence of various imperfections on the conversion efficiency of second–harmonic generation in quasi–phase–matching lithium niobate waveguides," *J. Opt. Soc. Am. B,* Optical Society of America, vol. 10, No. 2, Feb. 1993, pp. 222–229.

Kilin, S. Ya. and I.I. Fedchenia, "Stastics of random spikes in the intensity of stimulated Raman scattering: initiation by spatially distributed fluctuations," *J. Opt. Soc. Am. B,* Optical Society of America, vol. 10, No. 2, Feb. 1993, pp. 199–209.

Kurizki, G. et al., "Quantum electrodynamics in photonic band gaps: atomic–beam interaction with a defect mode," *J. Opt. Soc. Am. B,* Optical Society of America, vol. 10, No. 2, Feb. 1993, pp. 346–352.

Leoński, W., "Squeezed–state effect on bound–continuum transitions," *J. Opt. Soc. Am. B,* Optical Society of America, vol. 10, No. 2, Feb. 1993, pp. 244–252.

Leung, K.M., "Defect modes in photonic band structures: a Green's function approach using vector Wannier functions," *J. Opt. Soc. Am. B,* Optical Society of America, vol. 10, No. 2, Feb. 1993, pp. 303–306.

Maradudin, A.A. and A.R. McGurn, "Photonic band structure of a truncated, two–dimensional, periodic dielectric medium," *J. Opt. Soc. Am. B,* Optical Society of America, vol. 10, No. 2, Feb. 1993, pp. 307–313.

Meade, R.D. et al., "Nature of the photonic band gap: some insights from a field analysis," *J. Opt. Soc. Am. B,* Optical Society of America, vol. 10, No. 2, Feb. 1993, pp. 328–332.

Montemezzani, G. et al., "Photorefractive charge compensation at elevated temperatures and application to $KNbO_3$," *J. Opt. Soc. Am. B,* Optical Society of America, vol. 10, No. 2, Feb. 1993, pp. 171–185.

Mossberg, T.W. and M. Lewenstein, "Radiative properties of strongly driven atoms in the presence of photonic bands and gaps," *J. Opt. Soc. Am. B,* Optical Society of America, vol. 10, No. 2, Feb. 1993, pp. 340–345.

Robertson, W.M. et al., "Measurement of the photon dispersion relation in two–dimensional ordered dielectric arrays," *J. Opt. Soc. Am. B,* Optical Society of America, vol. 10, No. 2, Feb. 1993, pp. 322–327.

Smith, D.R. et al., "Photonic band structure and defects in one and two dimensions," *J. Opt. Soc. Am. B,* Optical Society of America, vol. 10, No. 2, Feb. 1993, pp. 314–321.

Söllüer, H. Sami and J. W. Haus, "Photonic bands: simple–cubic lattice," *J. Opt. Soc. Am. B,* Optical Society of America, vol. 10, No. 2, Feb. 1993, pp. 296–302.

Sugawara, T. et al., "Instability in a $CO_2$ sequence–band laser with a saturable absorber and vibration–to–vibration energy transfer processes," *J. Opt. Soc. Am. B,* Optical Society of America, vol. 10, No. 2, Feb. 1993, pp. 265–270.

Tong, B.Y. et al., "Fluorescence–lifetime measurements in monodispersed suspensions of polystyrene particles," *J. Opt. Soc. Am. B,* Optical Society of America, vol. 10, No. 2, Feb. 1993, pp. 356–359.

Wijekoon, W.M.K.P. et al., "Second–harmonic generation studies of differences in molecular orientation of Langmuir––Blodgett films fabricated by vertical and horizontal dipping techniques," *J. Opt. Soc. Am. B,* Optical Society of America, vol. 10, No. 2, Feb. 1993, pp. 213–221.

Yablanovich, E., "Photonic band–gap structures," *J. Opt. Soc. Am. B,* Optical Society of America, vol. 10, No. 2, Feb. 1993, pp. 283–295.

Zahavi, O. et al., "Study of amplified spontaneous emission systems by the ray–tracing technique," *J. Opt. Soc. Am. B,* Optical Society of America, vol. 10, No. 2, Feb. 1993, pp. 271–278.

Ziolkowski, R.W. and J.B. Judkins, "Full–wave vector Maxwell equation modeling of the self–focusing of ultrashort optical pulses in a nonlinear Kerr medium exhibiting a finite response time," *J. Opt. Soc. Am. B,* Optical Society of America, vol. 10, No. 2, Feb. 1993, pp. 186–198.

Translation of Japanese Patent Publication No. 64–80908.

\* cited by examiner

PHOTONIC BAND GAP DEVICE AND METHOD USING A PERIODICITY DEFECT REGION DOPED WITH A GAIN MEDIUM TO INCREASE PHOTONIC SIGNAL DELAY

CROSS-REFERENCE TO RELATED APPLICATION

This patent application claims priority to and is entitled to the benefit of Provisional Patent Application Number 60/134,536, filed May 17, 1999, entitled "Photonic Band Gap Device and Method Using a Periodicity Defect Region Doped with a Gain Medium to Increase Photonic Signal Delay." This provisional application is incorporated herein by reference in its entirety.

FEDERALLY SPONSORED RESEARCH AND DEVELOPMENT

This invention was made with Government support under Contract DAAH01-96-R234 awarded by the U.S. Army Missile Command. The Government has certain rights in the invention.

BACKGROUND OF THE INVENTION

1. Field of the Invention

The present invention relates to optical communications and optical signal control. In particular, the present invention relates to an optical device and method for delaying photonic signals.

2. Related Art

The fields of communications and data processing are currently transitioning from using electrical signals to using optical signals. As a result, there is an increased need for optical devices that perform various tasks in the control of these optical signals. Such devices include delay blocks for synchronizing optical pulses for communications. The synchronization of optical pulses requires the use of controllable delay devices which do not significantly distort the optical beam as it passes through the device. In particular, robust, compact, lightweight delay devices for use with a variety of predetermined optical frequencies must be developed to be easily integrated into existing optical systems.

One method of creating a low distortion, controllable photonic delay is through the use of "uniform" photonic band gap (PBG) structures, also called band-edge delay line devices. Uniform PBG structures typically comprise a stack of alternating layers of refractive materials of similar thicknesses, such as gallium arsenide and aluminum arsenide, which exhibit photonic band gaps in their transmission spectra. These alternating layers have different indices of refraction and can be deposited by well known deposition techniques onto a substrate.

By sending a photonic signal of a given frequency ($\omega$) through this type of delay device, the discontinuity of the indices of refraction imparts a delay to the photonic signal. These devices slow down the photonic signal as a result of scattering inside the uniform PBG structure. Since the photonic delay is proportional to the square of the number of periods contained in the uniform PBG structure, a device can be constructed that imparts a predetermined delay to a photonic signal. The physical processes involved in the photonic signal delay imparted by a uniform PBG structure are described in detail in Scalora, et al., "Ultrashort pulse propagation at the photonic band edge: large tunable group delay with minimal distortion and loss," Phys. Rev. E Rapid Comm. 54(2), R1078–R1081 (August 1996), which is incorporated by reference herein.

SUMMARY OF THE INVENTION

The present invention generally relates to a device and method of creating an optical signal delay using a compact and readily manufacturable structure. In particular, the present invention interposes a periodicity defect region into a uniform photonic band gap (PBG) structure in order to generate a transmission resonance spike of very narrow bandwidth at or near the center of the photonic band gap of the structure. The introduction of this periodicity defect causes at least an order of magnitude greater photonic signal delay duration than for a uniform PBG device of similar size.

According to one embodiment of the present invention, a Fabry-Perot delay line device is provided for delaying photonic signals of a predetermined frequency and a predetermined bandwidth by a predetermined delay. The Fabry-Perot delay line device includes a first region of periodically alternating layers of refractive materials which exhibit a photonic band gap structure, a second region of periodically alternating layers of refractive materials which also exhibit a photonic band gap structure, and a periodicity defect region interposed between the first and second alternating layer regions. The first region of periodically alternating layers of refractive materials comprises one or more first refractive material layers having a first thickness and a first index of refraction, and one or more second refractive material layers having a second thickness and a second index of refraction. The second region of periodically alternating layers of refractive materials comprises one or more third refractive material layers and one or more fourth refractive material layers. The third refractive material layer has a thickness and an index of refraction similar to or identical to the first refractive material layer of the first alternating layer region. The fourth refractive material layer has a thickness and an index of refraction similar to or identical to the second refractive material layer of the first alternating layer region. The interposed periodicity defect region has a different thickness than either the first or second thickness of the alternating layers of refractive materials in the first and second alternating layer regions. Additionally, the periodicity defect region can have a third index of refraction and a photonic transmission resonance, which are predetermined along with thickness to impart predetermined delay to the photonic signals that pass therethrough.

According to one feature of the present invention, the transmission resonance due to the interposition of this periodicity defect region is located in the center of the photonic band gap. Further, the transmission resonance corresponds to the predetermined frequency of the photonic signal traveling through the Fabry-Perot delay line device.

According to a preferred embodiment of the present invention, the Fabry-Perot delay line device is constructed on a semiconductor substrate using semiconductor materials such as aluminum arsenide (AlAs) and gallium arsenide (GaAs), as the first and second refractive material layers, respectively. Additionally, the periodicity defect region is also a semiconductor material.

According to a second embodiment of the present invention, the Fabry-Perot delay line device includes two or more periodicity defect regions interposed between the periodically alternating layer regions. This embodiment provides for delaying photonic signals of differing predetermined frequencies and predetermined bandwidths by a predetermined range of photonic signal delays.

According to one feature of the second embodiment of the present invention, the first and second photonic transmission resonances are located at different frequency positions in the corresponding photonic band gap of the Fabry-Perot delay line device. Further, the first transmission resonance corresponds to a first predetermined photonic signal frequency, and the second transmission resonance corresponds to a second predetermined photonic signal frequency. Thus, the device may impart different predetermined delays to the first and second predetermined photonic signals traveling therethrough.

According to a third embodiment of the present invention, at unable laser source generates photonic signals traveling through a Fabry-Perot delay line device. The delay imparted by the device varies as a function of the frequency of the photonic signals that pass therethrough.

According to another embodiment of the present invention, Fabry-Perot delay line device also includes electrical contacts located on the periodicity defect regions. A power supply source is coupled to the contact points to impart a variable voltage across the device which varies the indices of refraction of the periodicity defect regions, thereby varying the delay imparted to photonic signals passing therethrough.

Further, according to another embodiment of the present invention, both the band-edge or the Fabry-Perot delay line device can also be constructed using an optical fiber grating. According to this embodiment of the present invention, a fiber grating delay device comprises regions of alternating first and second sections, each section having a different index of refraction, which are periodically spaced along the fiber or waveguide. In addition, a periodicity defect region having a thickness from either the first or second section can be interposed between the regions of alternating sections. Further, piezo-electric or other suitable means can be coupled to the periodicity defect region to alter the optical path length of the periodicity defect region, thereby varying the photonic delay imparted to a photonic signal passing through the fiber grating delay device.

According to another embodiment of the present invention, a defect layer is doped with a gain medium.

Further features and advantages of the present invention, as well as the structure and operation of various embodiments of the present invention, are described in detail below with reference to the accompanying drawings.

BRIEF DESCRIPTION OF THE FIGURES

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE PREFERRED EMBODIMENTS

Table of Contents

Figure 1A:
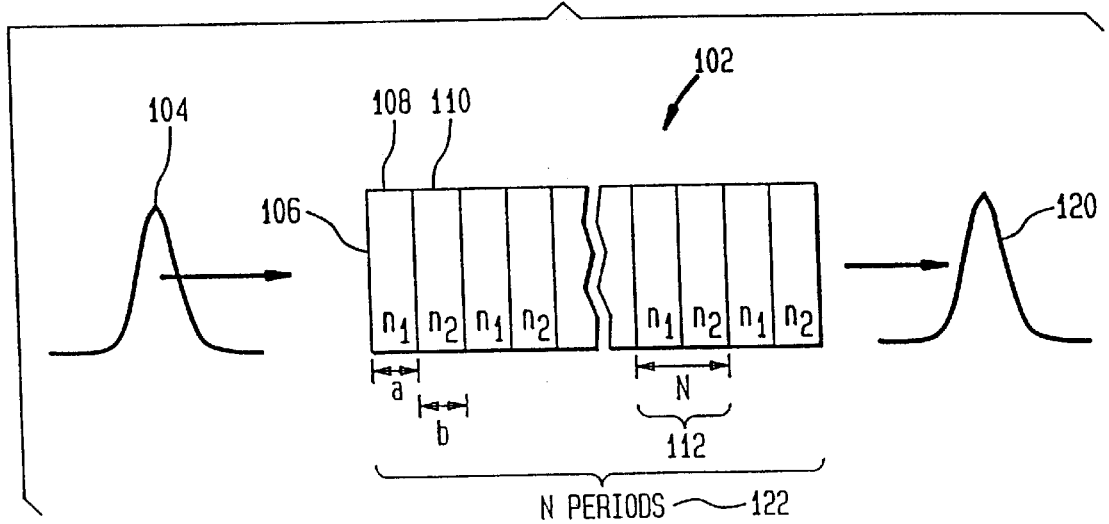
FIG. 1A is a schematic representation of a photonic signal delay device with a uniform PBG structure. This device is also referred to as a band-edge delay line device.

1. Overview and Discussion of the Invention
2. Terminology
3. Example Environment
4. Band-edge Delay Line Devices
5. Fabry-Perot Delay Line Devices
   a. Interposed Periodicity Defect in a Semiconductor Structurer
   b. Multiple Periodicity Defects
   c. Variable Photonic Signal Delay
   d. Fiber Grating Photonic Delay Devices
   e. Defect Layer Doped with a Gain Medium p1 6. Conclusion 1. Overview and Discussion of the Invention The present invention improves the current state of the art of photonic delay devices by interposing a periodicity defect into a uniform PBG structure in order to create a Fabry-Perot delay line device having a longer duration optical signal delay and which is compact and readily manufacturable. A Fabry-Perot delay line device, according to the present invention, can have an order of magnitude longer duration photonic signal delay compared to a uniform PBG structure of similar size.

According to the present invention, the introduction of a periodicity defect into a uniform PBG structure generates a transmission resonance spike of very narrow bandwidth in the photonic band gap of the device. This transmission resonance spike has a very narrow resonance frequency bandwidth. Thus, a photonic signal of a similar bandwidth to the resonance frequency bandwidth and an optical frequency corresponding to the frequency location of the transmission resonance spike is delayed by a predetermined amount.

2. Terminology

For the purposes of this disclosure, the following terms are used in describing the present invention:

"Photonic signals" refer to electromagnetic signals, including, but not limited to, optical signals, x-ray signals, and microwave signals. Photonic signals are described either in terms of their in-air wavelength ($\lambda$) or their photonic signal frequency ($\omega$), where $\lambda=c/(2\pi\omega)$.

"Photonic signal delay device" refers to any device that imparts a temporal delay on a photonic signal traveling therethrough.

"Uniform photonic band gap (PBG) structure" refers to a dielectric or semiconductor structure or fiber grating with alternating layers of material or sections of similar thicknesses having different indices of refraction periodically spaced on a substrate or along a fiber or waveguide. This type of structure is referred to, for example, as a "PBG structure" or a band-edge delay line device (See Scalora, et al., "Ultrashort pulse propagation at the photonic band edge: large tunable group delay with minimal distortion and loss," Phys. Rev. E Rapid Comm. 54(2), R1078–R1081 (August 1996) (incorporated by reference herein in its entirety). The word "uniform" describes the uniform periodical spacing of alternating layers or sections of similar thicknesses on a substrate or along a fiber. In addition, the term "uniform" distinguishes the conventional PBG structure, such as the band-edge delay line device described with respect to FIG. 1A, from the Fabry-Perot delay line device of the present invention.

"Fabry-Perot delay line device" refers to a PBG structure having at least one periodicity defect region interposed between periodically spaced alternating layer regions or sections in a semiconductor or fiber grating structure, according to the present invention.

"Periodicity defect" refers to a break in the periodicity of alternating refractive material layers or sections.

3. Example Environment

Before describing the present invention in further detail, it is useful to describe an example environment in which the invention can be implemented.

The present invention can be implemented in any system utilizing optical signals. The present invention is particularly helpful in communications systems that require the synchronization of optical signals generated from a variety of sources and locations. The present invention allows a degree of design flexibility with respect to the amount of delay imparted on the signals and also with respect to the optical frequency of the signal traveling through the device. This flexibility in the design of the photonic delay structures will allow a user to implement this invention in a variety of settings.

The present invention is described in terms of this example environment. Description in these terms is provided for convenience only. It is not intended that the invention be limited to application in this example environment. In fact, after reading the following description, it will become apparent to a person skilled in the relevant art how to implement the invention in alternative environments.

4. Band-edge Delay Line Devices

FIG. 1A is a schematic representation of a uniform PBG structure that can impart a predetermined photonic delay having a relatively limited duration as compared to the present invention. This type of device is also referred to as a band-edge delay line device. Device 102 receives photonic signals 104 of a predetermined frequency $\omega$ and a predetermined bandwidth $d\omega$ at the entrance interface 106. Device 102 comprises a stack of alternating layers 108 and 110 of refractive materials having predetermined indices of refraction $n_1$ and $n_2$, and predetermined thicknesses a and b, respectively. For example, first layer 108 can be designed to have a thickness (a) corresponding to the predetermined wavelength of the incoming photonic signal ($\lambda$), determined by the equation $a=\lambda/4n_1$. Similarly, second layer 110 can have an index of refraction $n_2$, and a thickness (b), where $b=\lambda/4n_2$. This pattern can be repeated for N periods 122, where a period is equal to one set of alternating layers 112.

Photonic signal delay can be determined as a function of the number of periods (N) 122 chosen and the characteristic photonic band gap transmission profile seen in FIG. 2, which is described below. This type of PBG structure is also known as a distributed Bragg reflector (DBR) and is typically used as a highly reflecting mirror in laser devices.

Figure 1B:
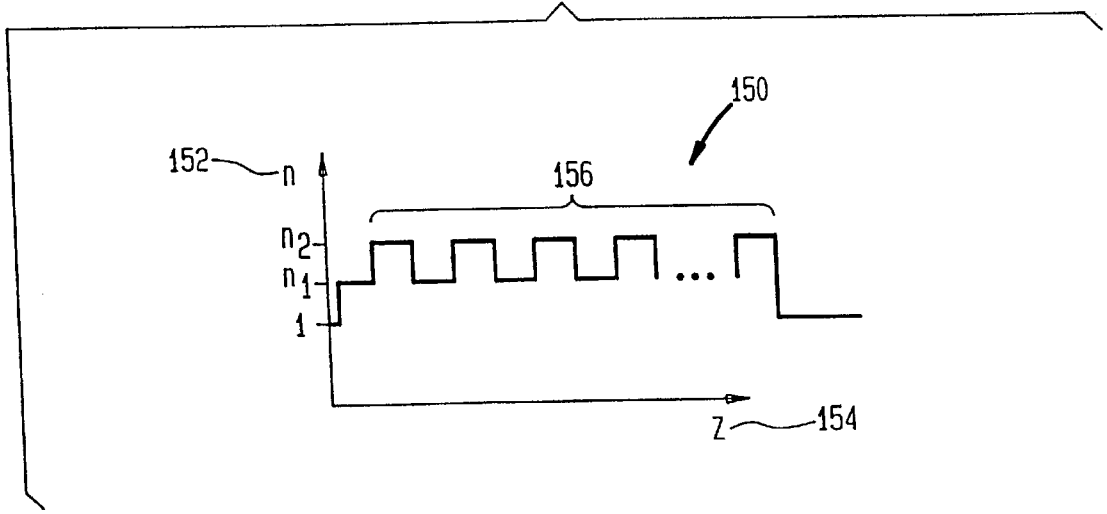
FIG. 1B is a diagram of the characteristic index of refraction profile of the uniform PBG structure shown in FIG. 1A.

FIG. 1B is a diagram of a characteristic index of refraction square-wave pattern profile of a uniform PBG structure for N periods. Diagram 150 plots the index of refraction (n) 152 of a uniform PBG structure as a function of distance (z) 154, which is limited by the number of periods 156 in the device. Diagram 150 illustrates the periodic nature of the abrupt refractive index changes occurring in the material. This abrupt change or discontinuity in the index of refraction of the material can be used to create photonic delay effects.

Figure 2A:
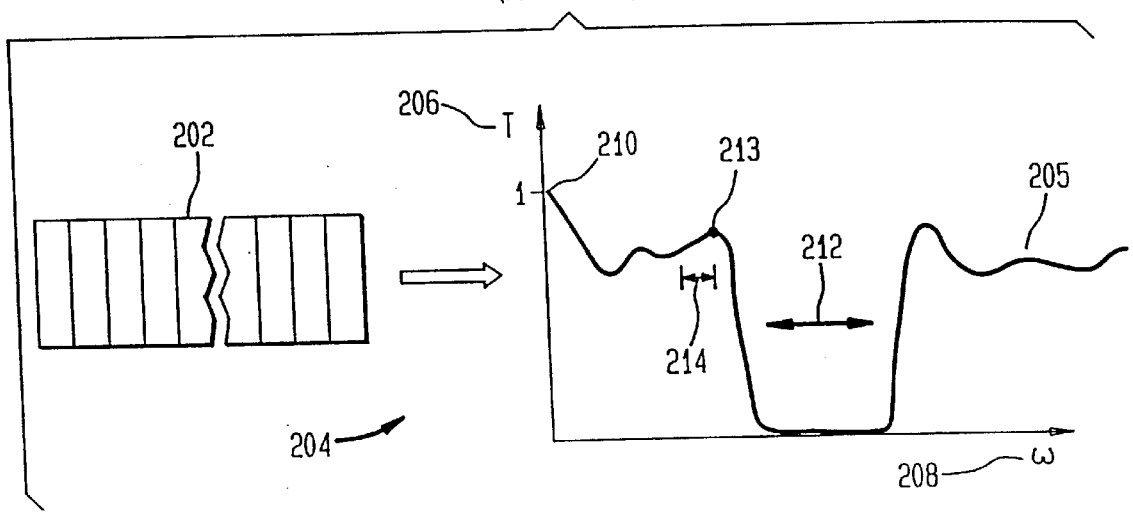
FIG. 2A is a characteristic transmission profile for the band-edge delay line device shown in FIG. 1A.

FIG. 2A displays a characteristic transmission profile 204 for a band-edge delay line device 202. Typically, the uniform PBG structure associated with device 202 exhibits an infinite number of photonic band gaps and band edges. Transmission profile 204 is a plot of such a representative photonic band gap. Transmission profile 204 is obtained by plotting the optical transmission 206 of device 202 as a function of frequency ($\omega$) 208. The maximum possible transmission 210 of the device is 1, which corresponds to all of the input photonic signal being transmitted through the device.

Transmission curve 205 undergoes a series of relative maxima and minima depending on the frequency $\omega$ of the input photonic signal. The photonic band gap 212 corresponds to the low transmission region of the profile. The maximum in transmission occurs at the photonic band edge 213. The band-edge delay line device can be designed so that the frequency corresponding to the photonic band-edge 213 matches the center frequency $\omega$ of the input photonic signal. In addition, the photonic band-edge transmission resonance bandwidth ($\delta\omega$) 214 can be designed to be at least as wide as the bandwidth $d\omega$ of the photonic signal in order to insure that the input photonic signal is not significantly distorted by the photonic signal delay device, whose pulsewidths are arbitrary in duration. Specifically, these devices can be designed to impart photonic delays on signals whose pulsewidths are on the order of picoseconds (ps) or less.

Figure 2B:
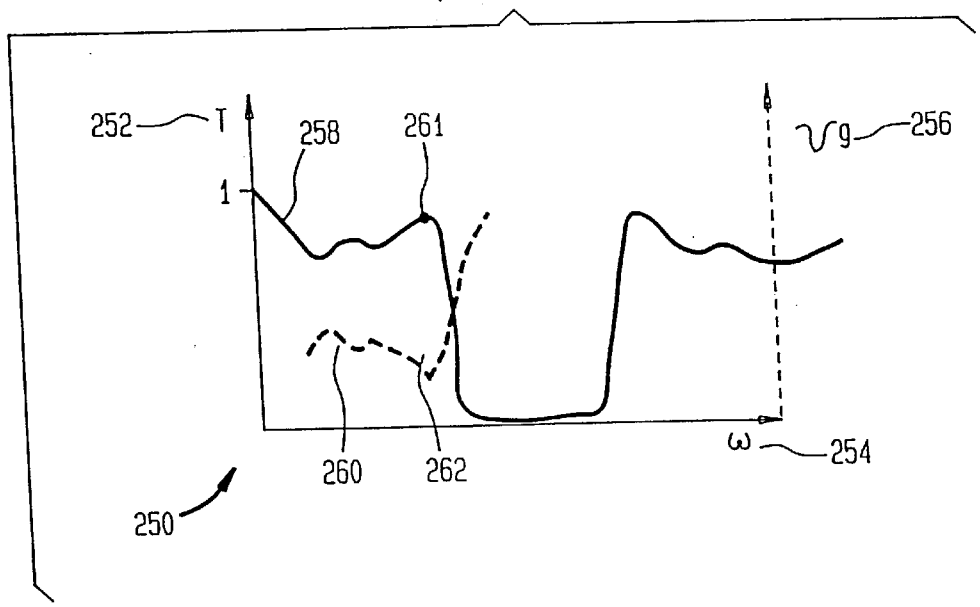
FIG. 2B is a transmission profile for the band-edge delay line device that also includes a group velocity curve for a photonic signal traveling through the structure.

Band-edge delay line device 202 operates as a photonic delay line because at every place in the band structure that there is a maximum in the transmission function, there is a corresponding minimum in the group velocity: hence, the smaller the group velocity, the larger the photonic delay. This principle is graphically illustrated in FIG. 2B. FIG. 2B shows a graph 250 where both the transmission curve 258 (solid-line) and the group velocity ($v_g$) curve 262 (dashed-line) are plotted as a function of frequency ($\omega$) 254. The transmission 252 of the input photonic signal is inversely related to the photonic signal's group velocity $v_g$ 256 as it travels through the band-edge delay line device 202. Graph 250 demonstrates that when the signal undergoes a maximum in transmission, such as at the photonic band-edge 261, the signal's group velocity $v_g$ is at a corresponding minimum 262. In practical terms, device 202 operates as a photonic signal delay line in that not only is the input photonic signal delayed substantially, but the light is maximally transmitted at the predetermined frequency ω.

Figure 3A:
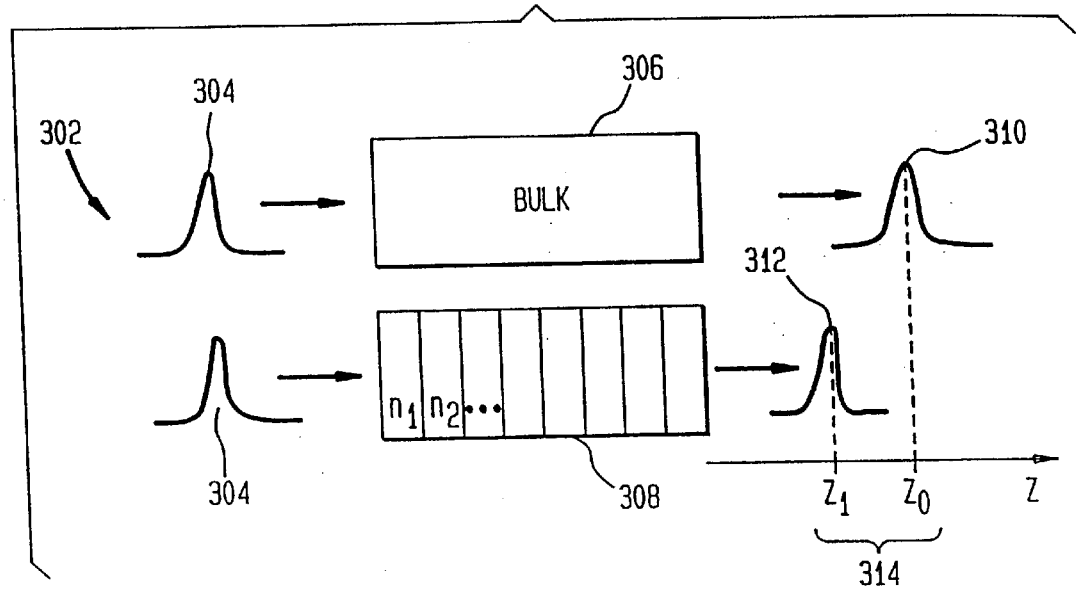
FIG. 3A is a schematic representation showing a photonic delay imparted by the band-edge delay line device of FIG. 1A.
Figure 3B:
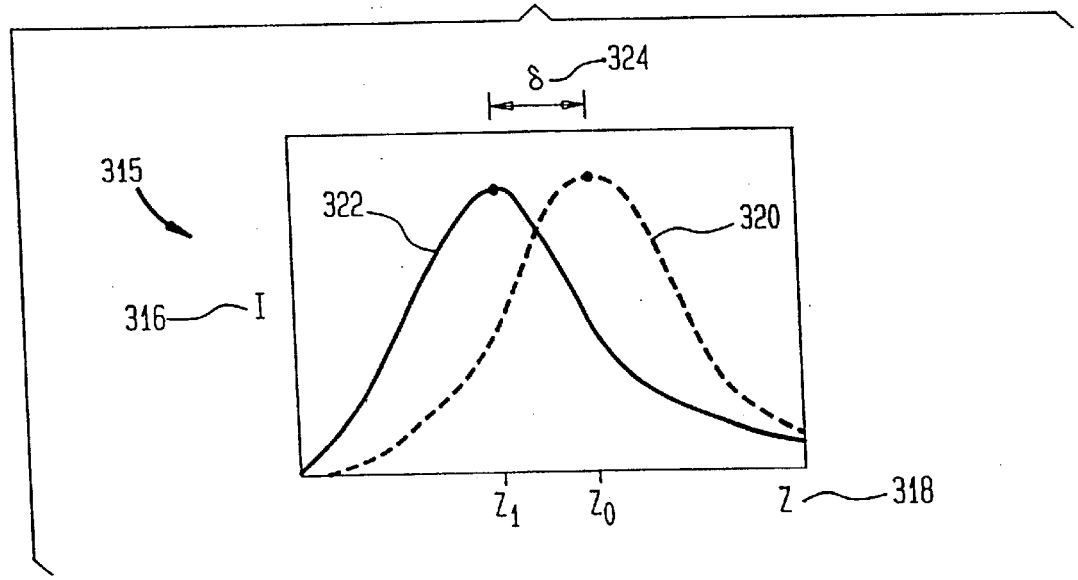
FIG. 3B is a plot of the photonic delay imparted by the same band-edge delay line device.

FIGS. 3A and 3B illustrate a photonic signal delay generated by band-edge delay line device 202. FIG. 3A shows a schematic representation of a photonic signal delay experiment 302. First, a picosecond (ps) pulse 304, having a center frequency ω and a bandwidth dω is directed towards a bulk material 306 that does not contain a stack of alternating layers of refractive materials having varying indices of refraction. Output signal 310 is then measured at some predetermined time (T) after being transmitted through the bulk material 306. The position in distance of output signal 310 after the time T is measured at a point in space $z_0$. Next, another ps pulse is delivered to band-edge delay line device 308 described in detail above. After a time T, this output signal 312 has a measured position in space corresponding to $z_1$. Thus, the photonic delay 314 imparted by band-edge delay line device 308 is the measured difference $z_0$–$z_1$.

FIG. 3B shows a graph 315 that illustrates the delay imparted by band-edge delay line device 308 in terms of signal intensity 316 as a function of distance traveled (z) 318 over a time T. Graph 315 plots the photonic signal delay (δ) 324 between the control photonic signal 320 (dashed-line), which traveled through bulk material 306, and the delayed photonic signal 322 (solid-line), which traveled through band-edge delay line device 308, when both are measured at a time T. Additionally, graph 315 demonstrates that band-edge delay line device 308 sufficiently preserves signal quality in terms of signal intensity 316 and pulse shape when comparing delayed signal 322 to control photonic signal 320. Because input pulse 304 has a sufficiently narrow bandwidth, all the frequency components of the pulse will have nearly the same group velocity ($v_g$), thereby avoiding any breakup or spreading of the pulse as it travels through band-edge delay line device 308. The net effect of the band-edge delay line device 308 on the photonic pulse is solely the delay, since there are no significant shaping effects taking place.

5. Fabry-Perot Delay Line Devices

In order to create a useful device for photonic delay in an optical system, an important parameter to maximize is the ratio (δ/L), where δ is the delay imparted by the PBG structure, and L is the length of the PBG structure. One known method of increasing photonic signal delay is to increase the number of periods (N) contained in a uniform photonic band gap structure. However, by increasing N, one simultaneously increases L, thereby failing to maximize the important δ/L ratio.

a. Interposed Periodicity Defect in a Semiconductor Structure

The present invention is directed towards maximizing the δ/L ratio by interposing a periodicity defect region into a uniform PBG structure. The periodicity defect causes a transmission resonance in the center of the photonic band gap, and thus increases δ dramatically without increasing L. This phenomenon is illustrated in FIGS. 4A and 4B.

Figure 4A:
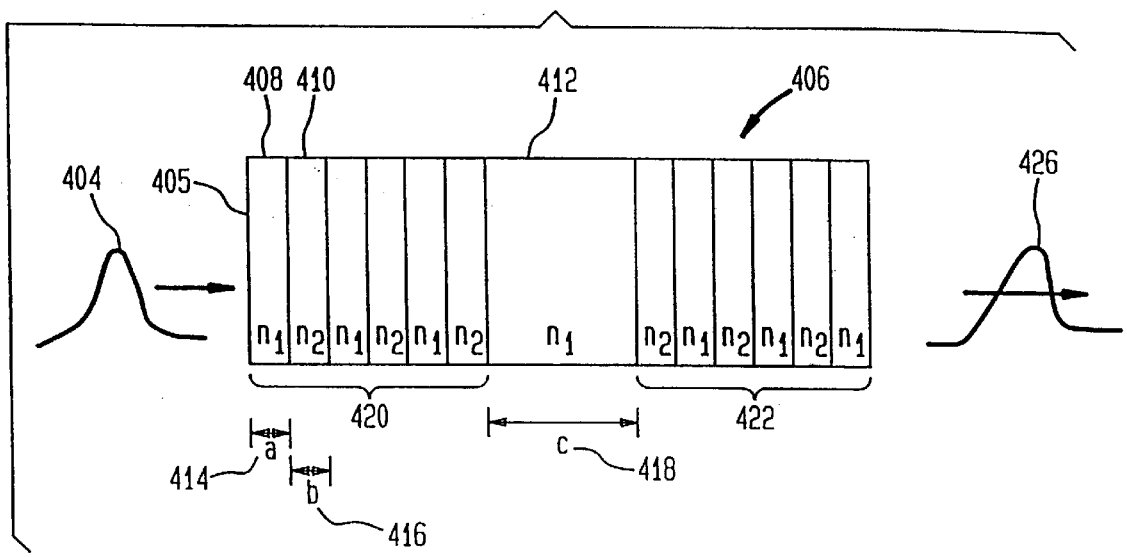
FIG. 4A is a schematic representation of a PBG structure photonic signal delay device according to one embodiment of the present invention. This device is herein referred to as a Fabry-Perot delay line device.
Figure 4B:
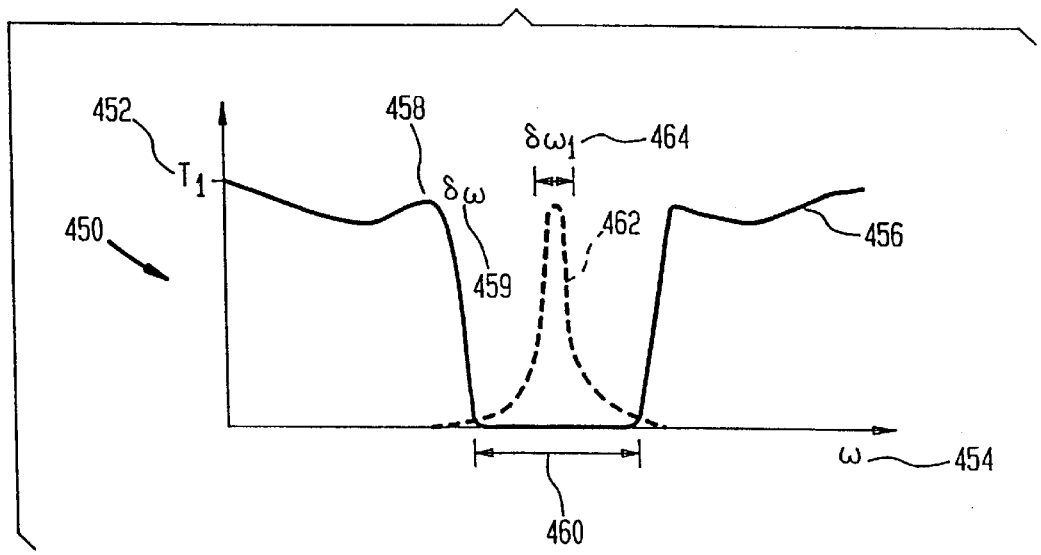
FIG. 4B is a characteristic transmission profile for the Fabry-Perot delay line device of FIG. 4A.

FIG. 4A is a schematic representation of a Fabry-Perot delay line device 406 according to one embodiment of the present invention. Device 406 receives photonic signal 404 of a predetermined frequency ω and a predetermined bandwidth dω at entrance port 405. Device 406 comprises at least two stacks (or regions) 420 and 422 of alternating layers 408 and 410 of refractive materials having predetermined indices of refraction $n_1$ and $n_2$, and predetermined thicknesses (a) 414 and (b) 416, respectively. In the center of the Fabry-Perot delay line device 406, a periodicity defect region 412 is interposed between two stacks 420 and 422, with each stack having an equal number of alternating layers of refractive material. Periodicity defect region 412 is also a refractive material having an index of refraction (n) that is equivalent to either $n_1$ or $n_2$. As mentioned previously, the term "defect", in this context, simply means a break in the periodicity of the structure. The thickness (c) 418 of periodicity defect region 412 is designed to be different than thicknesses a and b. For example, if layer thicknesses in the uniform stacks 420, 422 are taken to be one quarter-wavelength long, then the thickness of periodicity defect region 412 can be one half or one wavelength in thickness. However, other thicknesses for periodicity defect region 412 can be utilized, although only certain arrangements will maximize both transmission and delay at the same time. As the signal travels through the Fabry-Perot delay line device 406, a predetermined delay δ is imparted on the photonic signal, resulting in a delayed output photonic signal 426.

For example, in one embodiment of the present invention, a photonic signal 404 of in-air wavelength λ is delivered to Fabry-Perot delay line device 406. Layer 408 is a layer of gallium arsenide (GaAs), with an index of refraction of about 3.4 and a thickness (a) given by $a = \lambda/4n_1$. Layer 410 is a layer of aluminum arsenide (AlAs), with an index of refraction of about 2.9 and a thickness (b) given by $b = \lambda/4n_2$. Periodicity defect region 412 in this embodiment is a layer of GaAs, with a thickness (c) 418 of about λ. It should be noted that this type of structure is not limited to using only AlAs and GaAs periodic layers: other commonly known semiconductor materials such as indium arsenide (InAs), for example, can be also utilized in this structure, depending on the delay requirements of the user. Additionally, in one preferred example, thickness c is about two to four times greater than thicknesses a or b, which results in the photonic band gap profile 450 displayed in FIG. 4B. Of course, the present invention is not intended to be so limited as the thicknesses a, b, or c can be different relative distances. Further, instead of a semiconductor structure, another possibility includes the use of optical fiber or waveguide gratings to create photonic delay. A photonic delay device based on an optical fiber grating is described in detail below.

The interposition of periodicity defect region 412 creates a characteristic photonic band gap which is displayed in FIG. 4B, described in detail below. Fabry-Perot delay line device 406 is designed to alter incident photonic signals 404 only in terms of temporal delay: no shaping or pulsewidth characteristics are significantly altered.

The present invention represents a significant improvement over the state of the art in terms of photonic signal delay (δ); for the same number of periods (N) in a Fabry-Perot delay line device, the δ created can be at least an order of magnitude greater in the invention than in a band-edge delay line device (with no periodicity defect interposed). In practical terms, the present invention allows for an improved device with a length (L) equivalent to the length of band-edge delay line devices, but with a much larger δ.

The physical principle giving rise to this dramatic increase in the photonic delay is illustrated in FIG. 4B. Transmission profile 450 of Fabry-Perot delay line device 406 is plotted in terms of photonic signal transmission 452 as a function of frequency (ω) 454. Device 406 is referred to as a Fabry-Perot delay line device because the corresponding transmission resonance is usually found in Fabry- Perot resonators, well known to those skilled in the art. Transmission curve 456 undergoes a similar series of relative maxima and minima previously seen for the band-edge delay line device illustrated in FIG. 2A. The transmission curve 456 (solid-line) for device 406 also contains a relative transmission maximum at the photonic band-edge 458 that was also seen for the band-edge delay line device of FIG. 2A. Unlike FIG. 2A, however, a new transmission resonance peak 462 (dashed-line) is created at the center of the photonic band gap 460 as a result of the interposition of periodicity defect region 412. Fabry-Perot delay line device 406 can be designed so that the frequency corresponding to transmission resonance peak 462 matches the center frequency $\omega$ of photonic signal 402 (where, $\lambda=c/(2\pi\omega)$) to impart the maximum predicted photonic signal delay.

In general, the improvement in delay $\delta$ caused by the Fabry-Perot delay line device of the present invention is based on the narrower transmission resonance peak bandwidth $\delta\omega_1$; where $\delta\omega_1 \sim \delta\omega/10$ to $\delta\omega/100$, and $\delta\omega$ is the frequency band width of the photonic band-edge 459. Since $\delta\omega_1$ is narrower than $\delta\omega$, the frequency bandwidth of the input photonic signal ($d\omega$) must also be narrower to avoid beam distortion. This bandwidth requirement necessitates an increase in the photonic signal pulsewidth delivered to the Fabry-Perot delay line device of the present invention. For example, instead of delivering a picosecond (ps) pulse to the Fabry-Perot delay line device, the present invention is best utilized in a system where nanosecond (ns) pulses are sought to be delayed.

It should be noted that the above periodicity defect structure represents only one embodiment of the invention. One of the important aspects of the present invention is the flexibility to create a desired delay. For example, there is no particular restriction to work around the one-quarter wavelength periodicity of the alternating layers. In addition, the interposed periodicity defect region does not have to be larger than the alternating layer thicknesses nor is it required to be placed in the center of the structure. While manufacturing considerations may make a one wavelength or a one-half wavelength periodicity defect preferable over another thickness, there are no physical reasons why other thicknesses can not be attempted. Further, the placement of a periodicity defect region is not restricted to only the center of the delay device; a periodicity defect region can be placed at many different locations in the delay device, depending on the type of photonic delay desired. Fundamentally, as long as there is a break in the periodicity of the structure, the transmission resonance spike will appear at some location in the photonic band gap of the structure.

Figure 5:
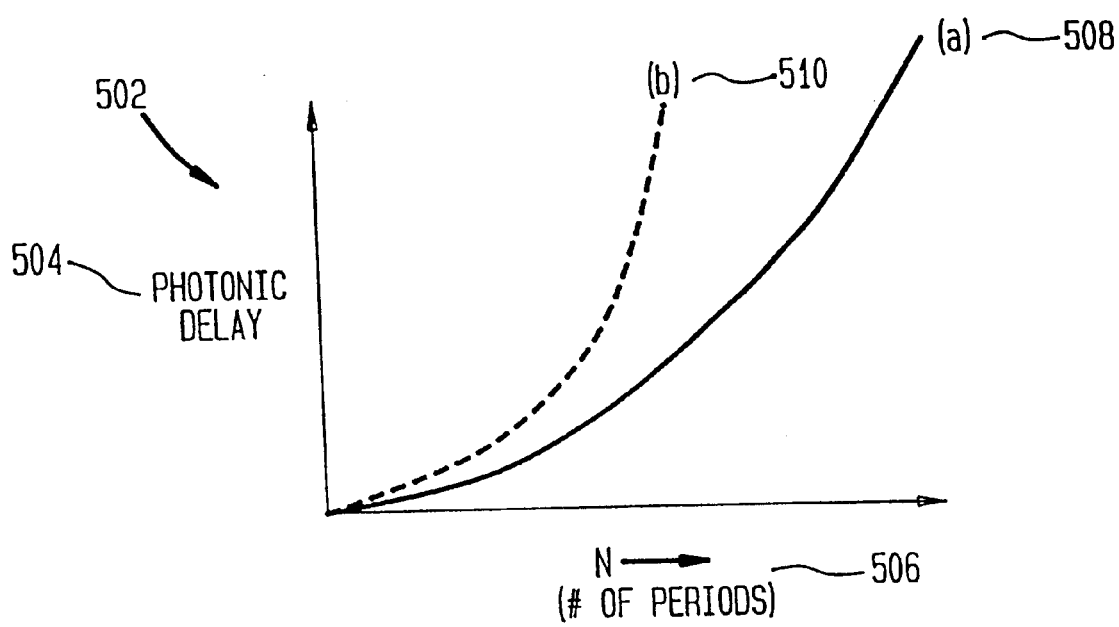
FIG. 5 is a graph representing photonic signal delay as a function of the number of periods that compares a band-edge delay line device to a Fabry-Perot delay line device according to the present invention.

FIG. 5 graphically illustrates the improvement in photonic signal delay created by the present invention. Graph 502 plots photonic signal delay 504 as a function of the number of periods (N) 506 within a band-edge delay line device 508 (curve (a), solid-line) and a Fabry-Perot delay line device 510 (curve (b), dashed-line) such as that described in FIG. 4. While curve (a) 508 follows an $N^2$ dependence, curve (b) 510 represents a steeper, $N^2 \cdot e^N$ dependence. As a result, according to the present invention, a significantly greater photonic signal delay is obtained as compared to a band-edge delay line device.

For example, a Fabry-Perot delay line device similar to device 406 described above was fabricated and tested. The Fabry-Perot delay line device comprised a total of 40 periods of GaAs/AlAs alternating layers grown on a GaAs substrate. In order to maximize the transmission from the structure to unity, a one-wavelength defect layer was introduced 18 periods from the surface, and 22 periods from the substrate. Actual measured delay was approximately 10 ps. Thus, the delay-to-device-length ratio was improved by approximately a factor of 20 over a band-edge delay line device, such as band-edge delay line device 102 described above.

b. Multiple Periodicity Defects

Figure 6A:
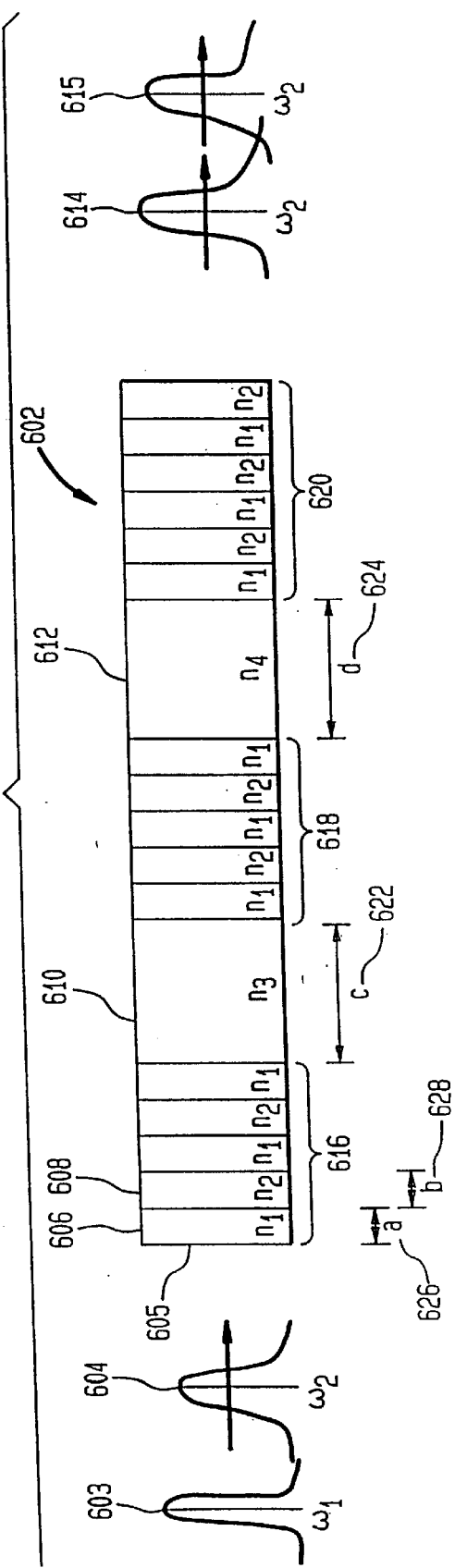
FIG. 6A is a schematic representation of a Fabry-Perot delay line device containing two periodicity defect regions according to a second embodiment of the present invention.

According to a second embodiment of the present invention, a Fabry-Perot delay line device is designed to impart predetermined delays on two photonic signals having different frequencies that travel through the device. FIG. 6A is a schematic representation of a second embodiment 603 of the present invention: a Fabry-Perot delay line device with at least two periodicity defect regions. Device 602 receives photonic signals 603 and 604 of different signal frequencies $\omega_1$ and $\omega_2$, respectively, and a predetermined bandwidth $d\omega$ at entrance port 605. Device 602 comprises at least three stacks (or regions) 616, 618 and 620 of alternating layers 606 and 608 of refractive materials having predetermined indices of refraction $n_1$ and $n_2$, and predetermined thicknesses (a) 626 and (b) 628, respectively. Two separate periodicity defect regions 610 and 612 are interposed in separate locations between the three stacks 616, 618 and 620, with each stack having an equal number of alternating layers of refractive material. Periodicity defect regions 610 and 612 are also refractive materials respectively having indices of refraction $n_3$ and $n_4$, that can be the same as either $n_1$ or $n_2$. The thicknesses (c) 622 and (d) 624 of the periodicity defect layers 610 and 612 are designed to be greater than the thicknesses a and b. In addition, periodicity defect layers 610 and 612 can be of equal thickness or of differing thickness, depending on the desired transmission resonances. As signals 603 and 604 travel through the delay device 602, a predetermined delay $\delta_1$ can be imparted on the photonic signal 603, and a second predetermined delay $\omega_2$ can be imparted on the photonic signal 604, resulting in delayed output photonic signals 614 and 615.

Figure 6B:
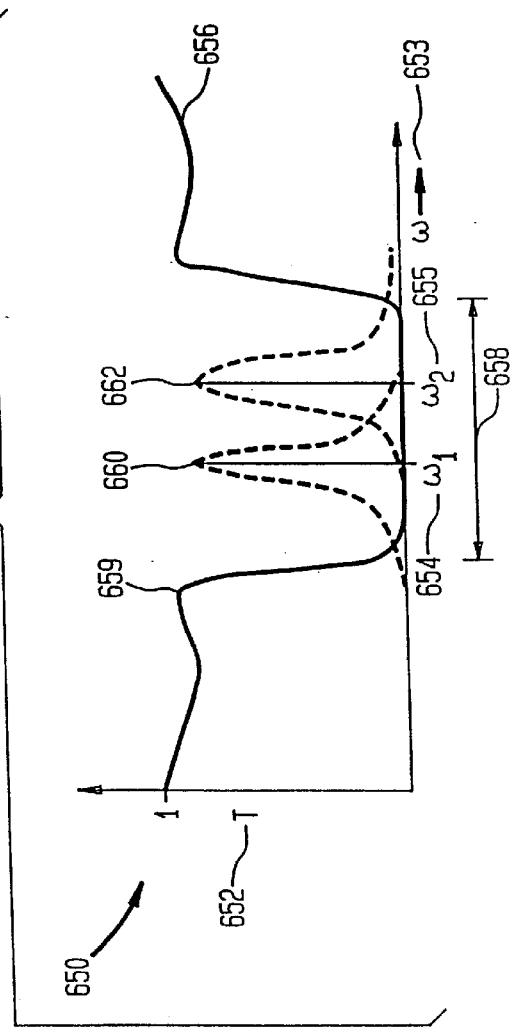
FIG. 6B is the corresponding transmission profile for the photonic signal delay device containing two periodicity defect regions shown in FIG. 6A.

Transmission profile 650 is shown in FIG. 6B. This graph represents the transmission profile of the second embodiment of the present invention, Fabry-Perot delay line device 602. FIG. 6B plots photonic signal transmission 652 as a function of frequency ($\omega$) 653. Transmission curve 656 undergoes a similar series of relative maxima and minima as previously seen in FIG. 2B. While the transmission curve 656 (solid-line) for Fabry-Perot delay line device 602 contains a relative transmission maximum at the photonic band-edge 659 that was also seen for the device of FIG. 4A, two transmission resonance peaks 660 and 662 (dashed-lines) are now created about the center of the photonic band gap 460 as a result of the interposition of the two periodicity defect regions 610 and 612. These separate resonance peaks 660 and 662 occur at frequencies $\omega_1$ and $\omega_2$, respectively. In order to best utilize delay device 602, it can be designed so that the frequencies corresponding to transmission resonance peaks 660 and 662 match the frequencies $\omega_1$ and $\omega_2$ of photonic signals 603 and 604 in order to impart the maximum delay on each optical signal.

As described above, the present invention provides the user with the flexibility of controlling the delay imparted by the Fabry-Perot delay line device by choosing an appropriate set of delay parameters. The user can control the location of the transmission resonance spikes and the input frequencies of the photonic signals. For example, one periodicity defect region can have a thickness on the order of $\lambda/2$, and a second periodicity defect region can have a thickness on the order of $\lambda$, where $\lambda$ corresponds to the optical in-air wavelength of the photonic signal(s) delivered to a Fabry-Perot delay line device, such as device 602. This arrangement generates separate transmission resonance spikes in the photonic band gap and, thus, can be used to pass two different frequencies of light. In one embodiment, the two periodicity defect regions can be placed in a PBG structure so that their positions are symmetric: the corresponding resonance spikes will also be symmetrically positioned about the center of the band gap. However, these periodicity defect regions do not have to be placed symmetrically within a PBG structure. In addition, the invention does not require that there be an equal number of alternating layers on either side of the periodicity defect regions, or that the number of periodicity defect regions be limited to only two. Different relative layer thickness and different numbers of layers will be apparent to one skilled in the art given this description.

C. Variable Photonic Signal Delay

Figure 7:
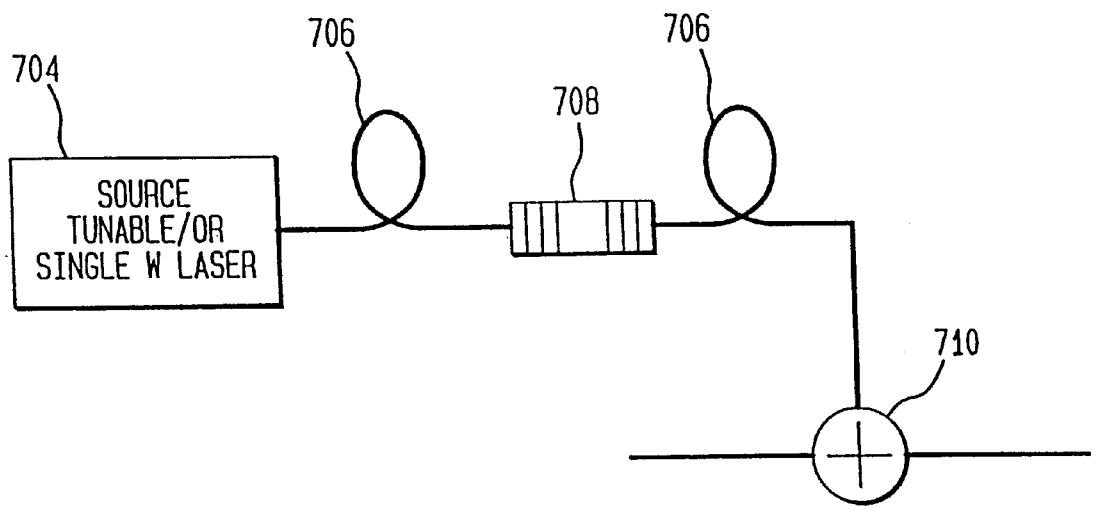
FIG. 7 is a schematic representation of a tunable laser source, according to a third embodiment of the present invention.

A third embodiment of the present invention is illustrated in FIG. 7. A tunable laser source 704 delivers various photonic signals via a fiber optic cable 706 to Fabry-Perot delay line device 708. These delayed signals can then be launched into a communications network 710 in synchronization with other photonic signals. Since a tunable laser source is capable of generating photonic signals that comprise a range of photonic frequencies, using the Fabry-Perot delay line device will impart varying photonic delays depending upon the frequency of the input photonic signals.

Figure 8:
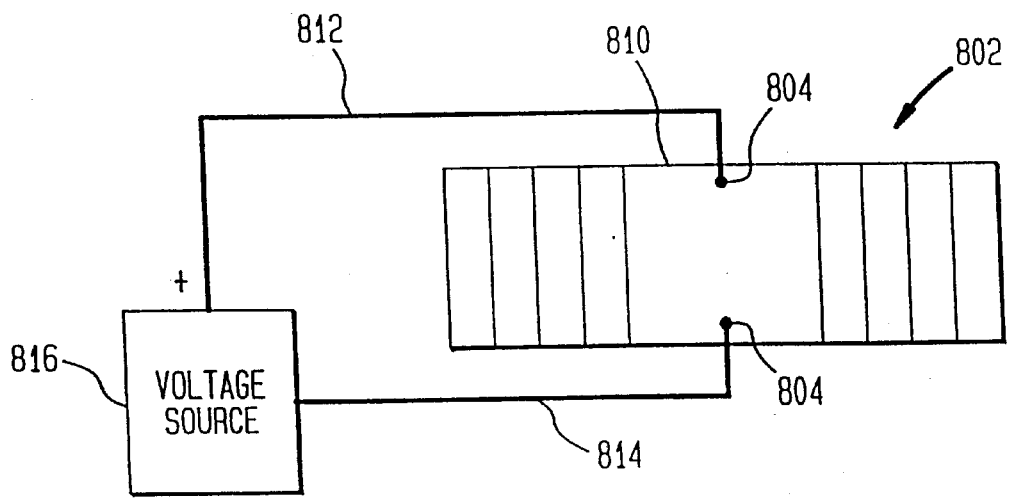
FIG. 8 is a schematic representation of the Fabry-Perot delay line device of FIG. 7 having a voltage applied to the device.

The embodiments described above represent the invention being used as a passive device, in which no voltage, bias current, or electromagnetic field is applied to the Fabry-Perot delay line device. However, a voltage can be applied to one or more defect regions of a Fabry-Perot delay line device to vary the index of refraction of the respective periodicity defect regions which comprise the structure. By varying the index of refraction of the periodicity defect regions, the delay imparted on the input photonic signals can be varied. This embodiment of the present invention is illustrated in FIG. 8, which displays a schematic of Fabry-Perot delay line device 802 connected to a voltage source 816. The power supply can apply a positive 812 or negative 814 voltage to the periodicity defect region of the structure at electrical contacts 804. By changing the voltage applied to the periodicity defect region 810, the index of refraction of region 810 changes. As a result, device 802 can thereby impart a varying photonic delay on the photonic signals passing therethrough.

d. Fiber Grating Photonic Delay Devices

According to a further embodiment of the present invention, optical fiber or waveguide gratings are also used to create photonic delay. Optical fiber gratings are similar to the types of PBG structures described above in that they are also periodic structures. The index of refraction for a fiber grating can achieve an index modulation depth (i.e., a high and low value) similar to that of high index contrast semiconductor structures. However, fiber gratings are structures with a smaller index discontinuity than that associated with a semiconductor PBG structure: for a fiber grating an index modulation along its core is typically on the order of $\delta n=10^{-3}$ to $10^{-4}$, as opposed to a semiconductor PBG structure with an index modulation approaching unity. Since the bandwidth of transmission resonances and band gaps are proportional to $\delta n$ (the index modulation depth), fiber grating delay devices are preferred for use with optical pulses of longer (i.e., nanosecond) duration in order to preserve their shape.

A fiber grating can be created on an optical fiber by well-known fabrication techniques. For example, see the fiber grating applications and fabrication techniques described in "Continuously tunable single-mode erbium fiber laser," by G. Ball and W. Morey, *Optics Letters*, Vol. 17, No. 6, p.420 (1992) and "Spatially-multiplexed fiber-optic Bragg grating strain and temperature-sensor system based on interferometric wavelength shift," by Y. Rao, et al., *Electronics Letters*, Vol. 31, No. 12, p. 1009 (1995), which are both incorporated by reference in their entirety herein.

For example, fiber grating fabrication can be accomplished by placing an optical "mask" over a photo-sensitive fiber core and then by illuminating the mask-fiber assembly with a high intensity ultraviolet light beam, such as an Excimer laser. The resulting grating, referred to as a fiber grating, displays much the same properties of a high index contrast semiconductor PBG structure, especially with respect to band gaps and transmission resonances. In addition, a mask can be designed to create a grating which imparts either a band-edge delay line effect or a Fabry-Perot delay line effect.

According to one example embodiment of the present invention, a fiber grating photonic delay device comprises alternating sections having different indices of refraction periodically spaced along the fiber or waveguide. According to another example embodiment of the present invention, the fiber grating photonic delay device can comprise a periodicity defect region interposed between the regions of alternating sections. Thus, the fiber grating photonic delay device operates according to the same physical principles that apply to the semiconductor band-edge and Fabry-Perot devices described above: the periodic nature of the abrupt refractive index changes caused by the grating occurring in the material can be used to create photonic delay effects. When an electromagnetic field is applied to the fiber core with the mask, the index of refraction is changed in the portion of the fiber that is exposed to the illumination. In other words, once the field enters the fiber core it permanently alters the refractive index of that region. Thus, the fiber device consists of sections where the index of refraction is altered and sections where the refractive index is unchanged. The spacing of these alternating refractive index sections can be based on one-quarter wavelength section thicknesses such as those described for the above band-edge delay line device. Alternatively, the periodic nature of the spacings can be broken, with one or more periodicity defect regions interposed, depending on the delay required, similar to the Fabry-Perot delay line devices described above. For example, two or more regions of the fiber grating can comprise sections that periodically alternate proportional to the in-air wavelength λ of the incoming optical signal in order to maximize both transmission and delay. A periodicity defect region of a different optical path length can be interposed between these two regions of alternating sections, resulting in a transmission resonance similar to those described above.

As mentioned earlier, a PBG structure can also be used as a variable photonic delay device. However, in the case of a fiber grating, the location of a Fabry-Perot resonance can be changed in the frequency domain, and hence tuned by piezo-electric means, as opposed to electro-optic means. That is, a voltage can be applied to the defect region, as shown in FIG. 8, in the fiber grating embodiment of the present invention not to cause a change in index of refraction, but rather to cause slight pressure to be applied in the periodicity defect region. The pressure, in turn, causes a slight elongation (or physical stretching) of the periodicity defect region, and hence a change of its optical path. This method is thus equivalent to modifying the refractive index by electro-optic means, leading to a variable photonic delay.

e. Defect Layer Doped with a Gain Medium

An embodiment of the present invention includes a defect layer doped with a gain medium. An increase in the density of modes essentially means that the density of photons increases at a particular frequency. This increase can be accomplished by utilizing a defect layer that is doped with a gain medium. The introduction of gain automatically causes an increase in the photon density, and therefore, a narrowing of the density of modes. This allows tuning of the group velocity, just as if periods were being added.

There are several advantages to this scheme. First, once a structure including a defect layer doped with a gain medium is built, the maximum delay can simply be modified by changing the structure's gain. Second, since this scheme does not alter delay by tuning a field across a structure's resonance, there is no loss of signal. On the contrary, the signal is amplified. Absorption (which represents negative gain) can also be used to tune the group velocity, although the transmitted signal may in this case be reduced.

Figure 9:
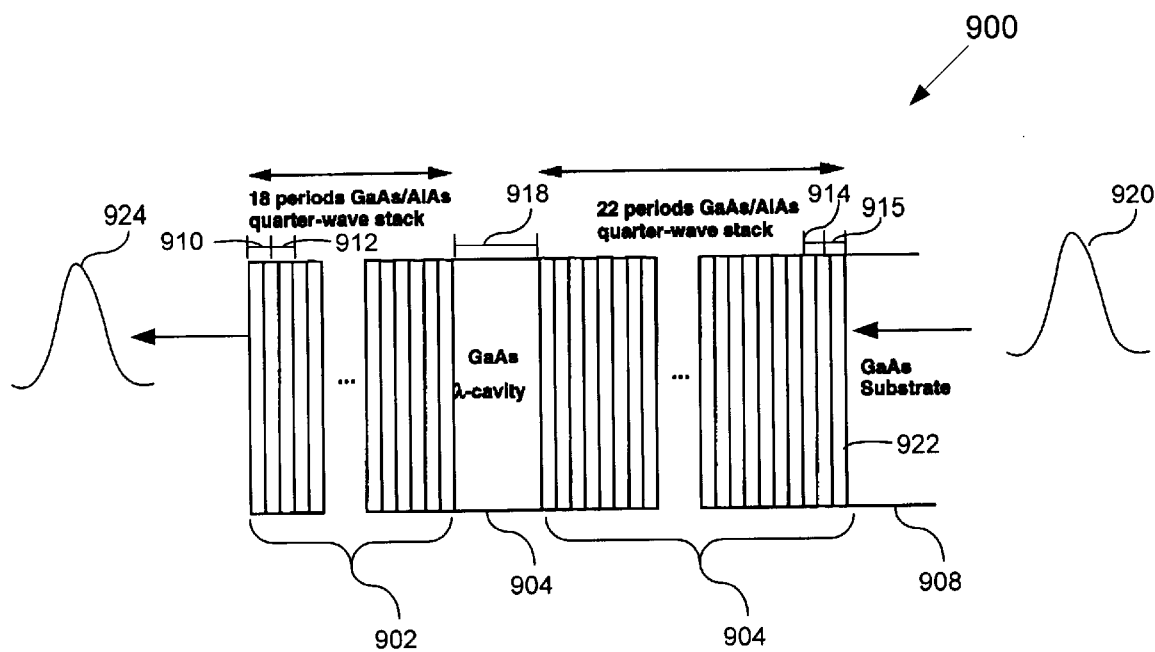
FIG. 9 is a schematic representation of a GaAs/AlAs PBG structure.

FIG. 9 depicts a structure 900 grown on a GaAs substrate. Structure 900 includes at least two stacks (or regions) 902 and 906 of alternating layers of refractive materials. The alternating layers in stack 902 have predetermined indices of refraction $n_1$ and $n_2$. The alternating layers in stack 906 have predetermined indices of refraction $n_3$ and $n_4$. The alternating layers in stacks 902 and 906 have predetermined thicknesses (a) 910, (b) 912, (c) 914, and (d) 916, respectively. In the center of the structure 900, a periodicity defect region 904 is interposed between stacks 902 and 906. As illustrated in FIG. 9, stack 902 comprises 18 periods of alternating GaAs and AlAs layers. However, stack 906 comprises 22 periods of alternating GaAs and AlAs layers. Periodicity defect region 904 is a GaAs cavity having a one wavelength thickness 918. As mentioned previously, the term "defect", in this context, simply means a break in the periodicity of the structure. Structure 900 receives a photonic signal 920 of a predetermined frequency ω and a predetermined bandwidth dω at an entrance port 922. As photonic signal 920 travels through structure 900, a delay d is imparted on photonic signal 920, resulting in a delayed output photonic signal 924.

This configuration creates a sharp transmission resonance with a full width at half maximum of $\delta\lambda$=0.34 nm in the middle of the photonic band gap, at $\lambda$=1550 nm, and maximizes the transmission to unity. The properties of this transmission resonance inside the gap are similar to the properties of the photonic band edge resonances, except for the location of the transmission resonance, and the magnitude of the group velocity, or group index, at the defect mode, which is about two orders of magnitude larger than the group index of the band edge delay line discussed above.

For structure 900, the maximum group index is about $N_g$=300. Due to the limited bandwidth of structure 900, any pulse tuned at the resonance maximum, and whose duration is greater than about 100 ps or so will propagate at the group velocity of C/300. The physical length of structure 900 is approximately L=10.3 microns; taking C=3×10$^8$ m/sec., thereby producing a delay of approximately d=8–10 picoseconds.

The exploration of ways to tune delay in photonic band gap structures has led to some unexpected and interesting new results. One such result occurs when a gain medium is introduced in periodicity defect region 904. This means that electrical or optical pumping of the Fabry-Perot (F-P) cavity (periodicity defect region 904) is introduced. As photonic signal 920 makes its way through structure 900, it experience some gain, i.e., the density of photons increases. This causes photonic signal 920 to slow down further. This reduction in speed depends exponentially on the amount of gain present, as described below with reference to FIG. 10.

According to the present invention, periodicity defect region 904 is doped to change the absorptive and emissive properties of the original semiconductor so that the electrons of periodicity defect region 904 are excited to a higher state, thereby placing them in a position to give up that energy to photonic signal 920. Accordingly, photonic signal 920 is amplified according to a gain. Such doping can be with beryllium atoms, carbon atoms, and/or with any other substance, as would be apparent to persons skilled in the relevant art(s).

In a doped semiconductor material, such as doped periodicity defect region 904, there are many ways to put electrons in an excited state. One such way involves optical pumping. Optical pumping involves the injection of optical energy in a manner that excites electrons from a lower level to an upper level. Such electrons will remain at an upper level until photonic signal 920 absorbs photons from them.

Another way to put electrons in an excited state is through the injection of an electrical current. The electrical current causes the electrons to enter an excited state, until photonic signal 920 absorbs photons from the excited electrons. This approach differs from the approach described above with reference to FIG. 8, where a voltage is applied to periodicity defect region 810 to change its index of refraction. In contrast, applying an electrical current to doped periodicity defect region 904 produces a gain. Thus, some of the electrical current is captured in doped periodicity defect region 904 region to generate light, thereby producing gain.

Figure 10:
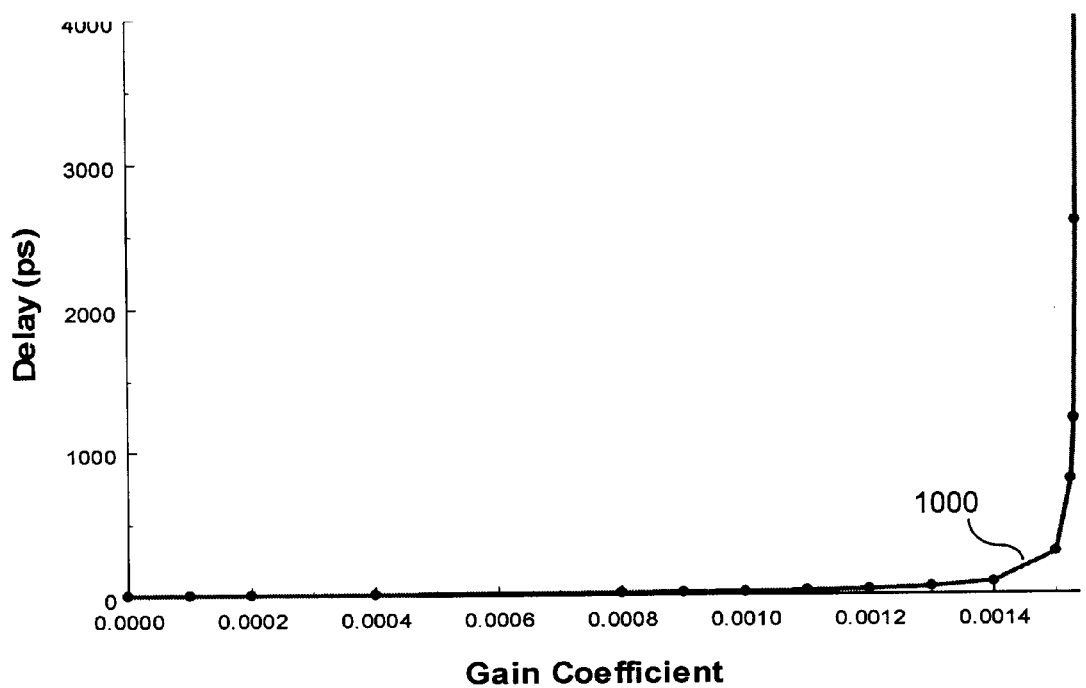
FIG. 10 depicts delay versus gain coefficient for the structure depicted in FIG. 9.

FIG. 10 is a plot 1000 of delay d as a function of the gain coefficient for structure 900. As illustrated in FIG. 10, delay d of photonic signal 920 increases with the gain coefficient. As described herein, the gain coefficient increases as more energy is injected in periodicity defect region 904. Thus, the present invention provides a mechanism that enables the tuning of gain (or loss). Accordingly, this tuning mechanism provides the ability to modulate, or change, the delay of photonic signal 920 by changing the gain of structure 900.

It is important to note that the generic term gain can also be used to indicate absorption. That is, gain causes an increase in the density of modes, a reduction of the group velocity, and an increase in delay. On the other hand, absorption causes a reduction of the density of modes, an increase of the group velocity, and hence a decrease in delay.

This gain(or loss)-tuning mechanism for photonic signals 920, such as nanosecond pulses, constitutes a major achievement because of the limitations involving the production of devices, such as structure 900. One such limitation involves device geometry, which is dictated by molecular beam epitaxy (MBE) fabrication techniques. For instance, according to current MBE techniques, it is difficult to regulate the thickness of layers in structures having greater than 40 layers. Another limitation involves economics. According to some estimates, the cost to produce each layer of a structure is relatively expensive. Without the introduction of a gain medium, these limitations place constraints on the maximum delay obtainable at a reasonable cost.

However, as FIG. 10 illustrates, the above limitations are removed by devices, such as structure 900, or any similar or equivalent structure as would be apparent to persons skilled in the relevant art(s). For such devices, by simply introducing and modulating the maximum gain, the maximum delay can be tuned well beyond the maximum value dictated by the geometry of the device.

According to one embodiment of the present invention, ordinary vertical cavity surface emitting laser (VCSEL)

diodes can be implemented as a defect layer doped with a gain medium. These devices include a gain doped defect layer as in a delay line cavity. Furthermore, VCSELs are currently available at negligible cost. The gain coefficients present in ordinary VCSELs or diode lasers can be made to equal or approximately equal the gain coefficients illustrated above with reference to FIG. 10.

Figure 11:
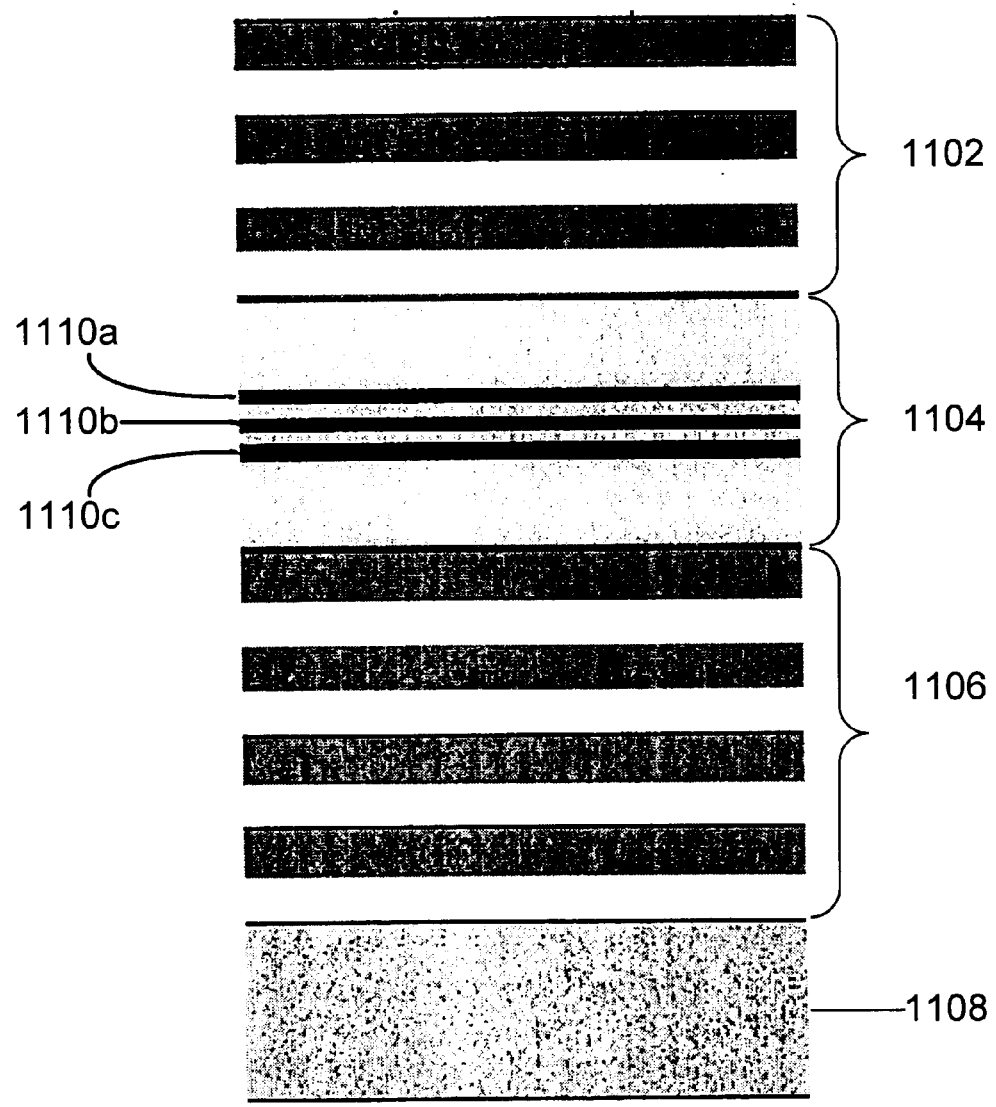
FIGS. 11 and 12 provide two views of a vertical cavity surface emitting laser (VCSEL), according to the present invention.
Figure 12:
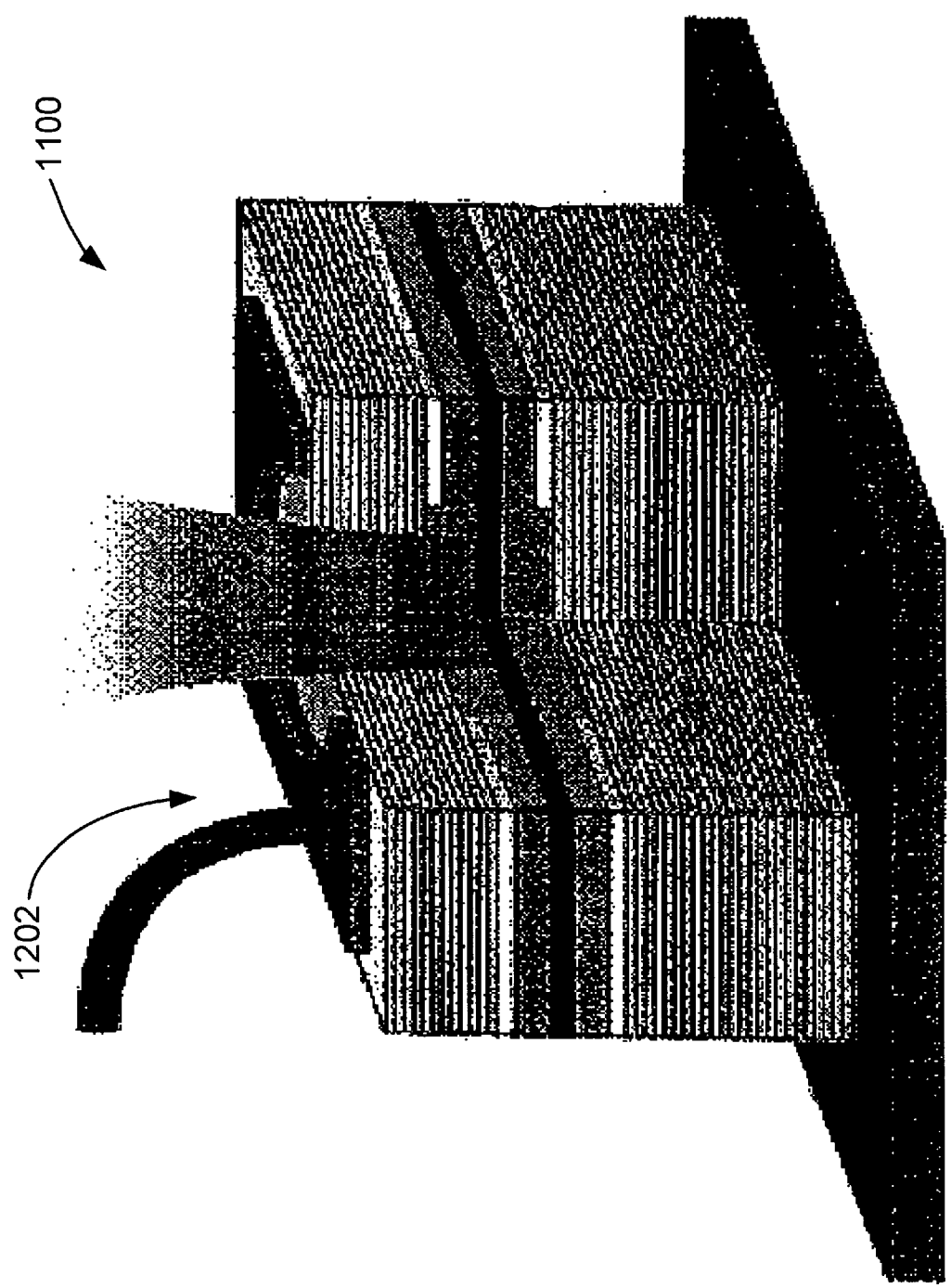

FIGS. 11 and 12 provide two views of a VCSEL 1100 according to the present invention. VCSEL 1100 includes two stacks 1102 and 1106 of alternating layers of refractive materials, each layer having predetermined indices of refraction and predetermined thicknesses. In an embodiment, each stack is a quarter-wave mirror stack, where stack 1102 is 99.0% reflective and stack 1106 is 99.9% reflective. Adjacent to stack 1106 is a GaAs substrate 1108. In the center of the structure 1100, a periodicity defect region 1104 is interposed between stacks 1102 and 1106. Periodicity defect region 1104 is doped with a gain medium. In an embodiment, this doping comprises three quantum wells 111a–110c. This doping is performed in such a way that when a current is injected in periodicity defect region 1104, atoms go to an excited state, and give up a photon when returning to the ground state. Such an injection of current creates gain. Accordingly, when a photonic signal 1112 at a predetermined frequency ω and bandwidth dω is input to an entrance interface 1116, a delayed photonic signal 1114 results. The magnitude of this delay varies according to the amount of electrical current injected in periodicity defect region 1104.

FIG. 12 illustrates a second view of VCSEL 1100. In addition FIG. 12 illustrates the injection of an electrical current 1202 into VCSEL 1100. The gain of VCSEL 1100 is controlled by modulating electrical current 1202 (as indicated by the arrow). The power output of VCSEL 1100, and hence its gain, is proportional to electrical current 1202. Thus, the velocity of photonic signal 1112 is controlled by modulating electrical current 1202. Accordingly, as electrical current 1202 increases, the velocity decreases. A decrease in velocity causes an increase in delay of the input pulse.

According to the present invention, the injection of electrical current in VCSEL 1100 causes lasing at a particular wavelength. In an embodiment, the wavelength of photonic signal 1112 has the same wavelength.

A doped YCSEL structure whose initial resonance width is not too thin that it can be easily fabricated. In this embodiment, an injected external pulse laser source is input to the doped VCSEL structure.

In one example a VCSEL structure as described by Bouche et al. is used as a delay device according to the present invention. See Bouche et al., *Dynamics of Gain in Vertical Cavity Lasers and Amplifiers at* 1.53 um *using femtosecond photoexcitation*. 73 Applied Physics Letters 2718 (Nov. 9, 1998) (hereinafter Bouche) (incorporated herein by reference in its entirety). As described in Bouche, this structure can be a 3.5λ cavity with an active medium composed of 2×9 InGaAsP strained multiple quantum wells placed at antinodes. The active medium is sandwiched between two and four pairs of Si/SiO2 mirrors with reflectivities of 96.2% and 99.7%, respectively.

Figure 13:
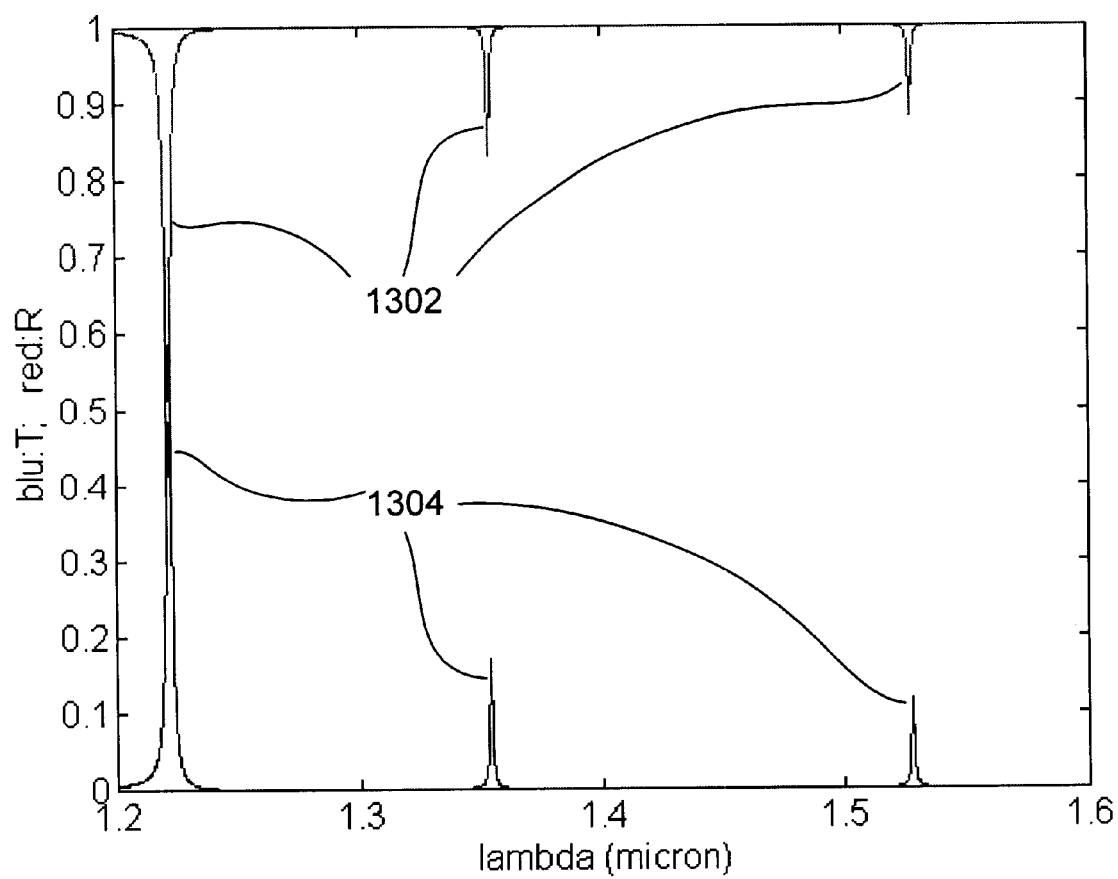
FIGS. 13–19 are plots illustrating VCSEL performance.

FIG. 13 is a plot 1300 of the reflectance 1302 and transmittance 1304 for the passive structure described in Bouche.

Figure 14:
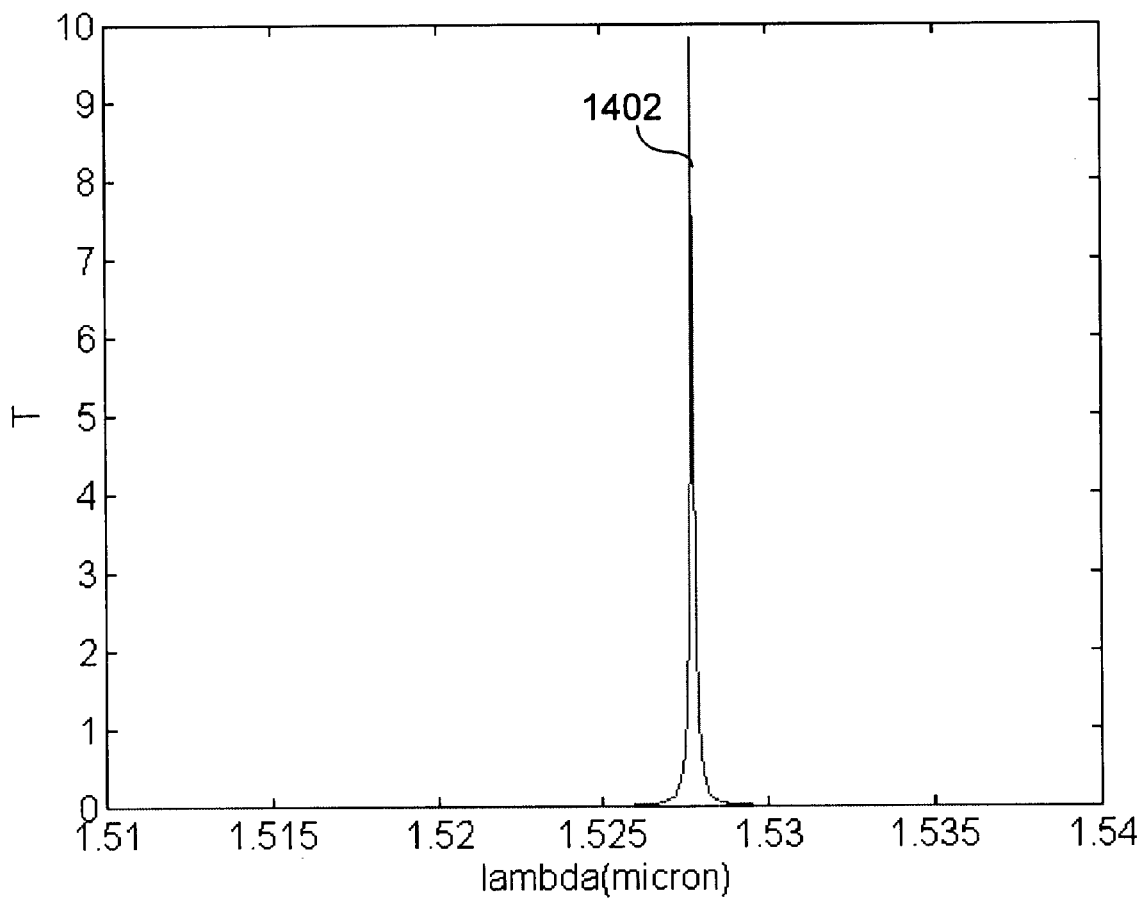

According to one example of the invention, gain in the central part of the quantum well region is introduced in the structure described in the Bouche et al. article. An increase was observed in the transmission. FIG. 14 is a plot of the resonance 1402 of this structure located near 1528 nm when gain is introduced. This gain causes causes significant narrowing of the line.

Figure 15:
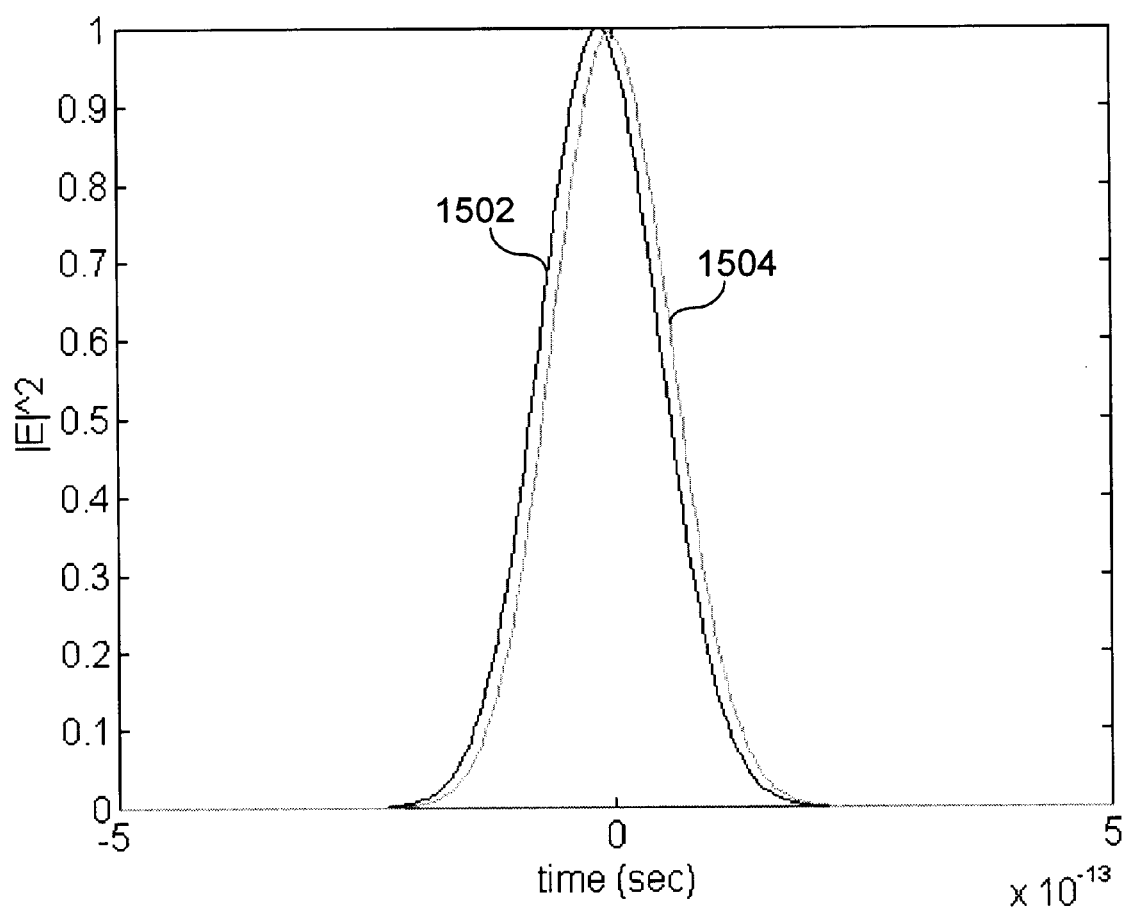

FIG. 15 is a plot illustrating the propagation of the transmitted and reflected pulses 1502, for an input pulse whose FWHM=120 fs, without gain or loss (i.e., the linear results of the Bouche structure are displayed). For comparison, a pulse 1504 that propagates in free space through a distance D=to the length of the device is also plotted.

Figure 16:
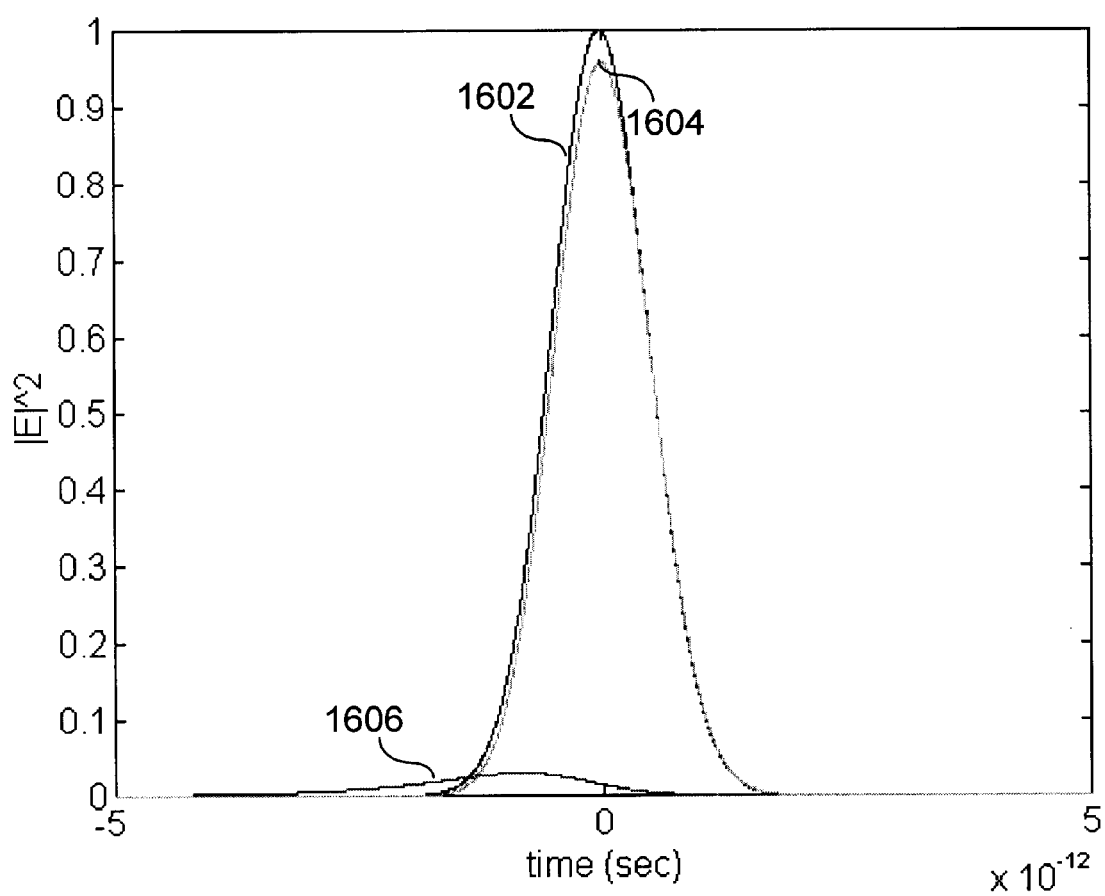

FIG. 16 is a plot illustrating the delay of a 1 ps pulse to show that it couples better with the structure, and hence the delay increases. This plot includes a reference free space pulse 1602, a reflected pulse 1604, and a delayed transmitted pulse 1606.

Figure 17:
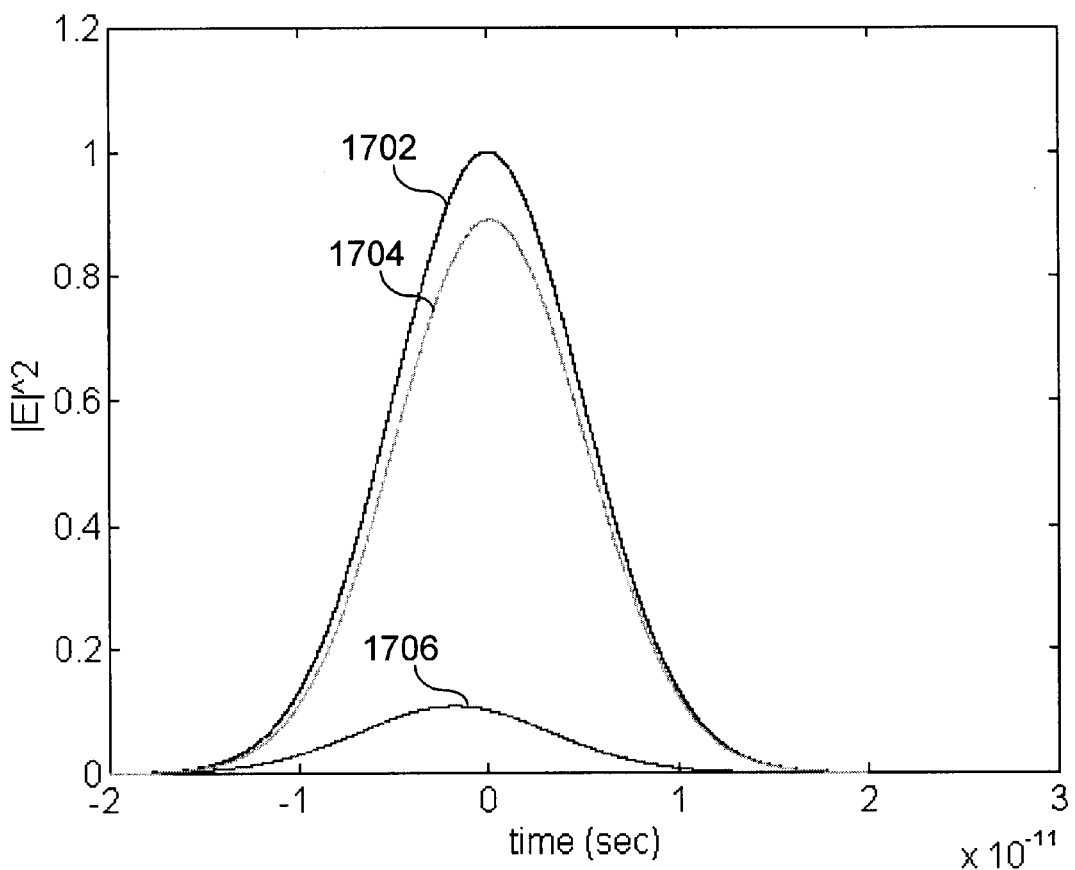

FIG. 17 is a plot illustrating the delay of a 10 ps input pulse. This plot includes a reference free space pulse 1702, a reflected pulse 1704, and a delayed transmitted pulse 1706.

Figure 18:
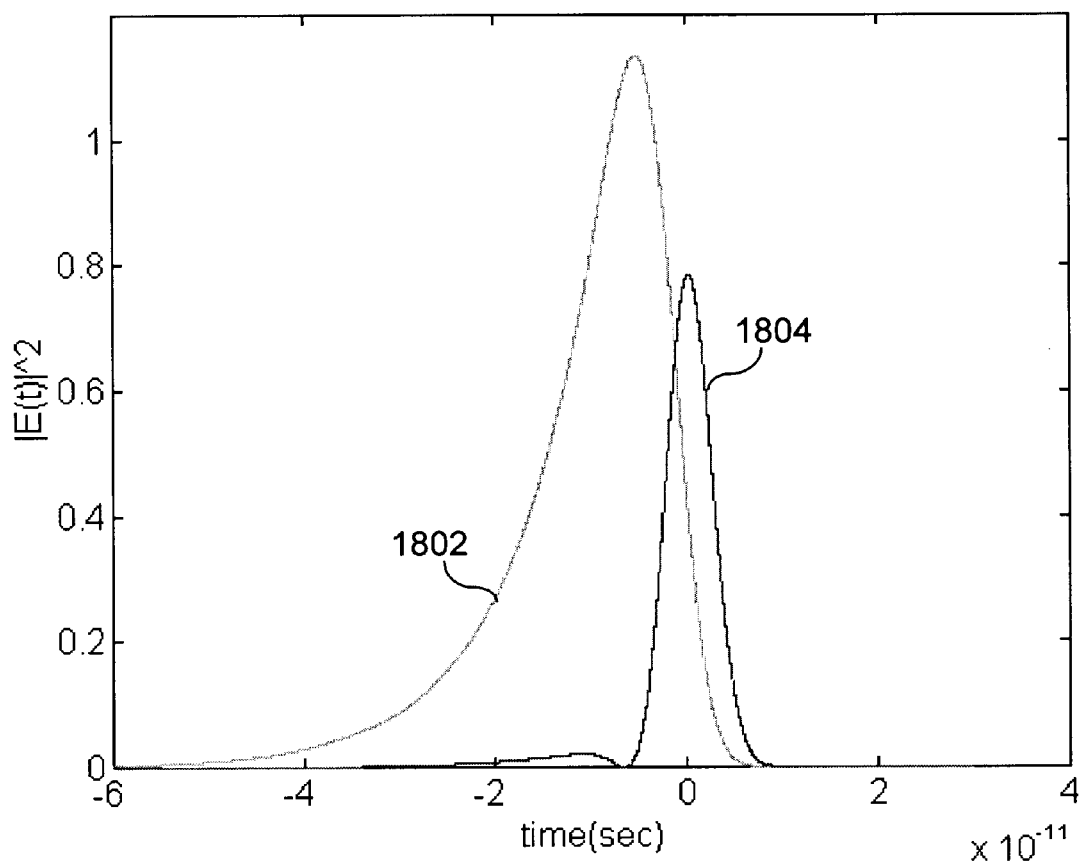

FIG. 18 is a plot illustrating the delay of a 5 ps input pulse when the Bouche structure is doped with a gain material. This plot includes a delayed transmitted pulse 1802 and a reflected pulse 1804.

Figure 19:
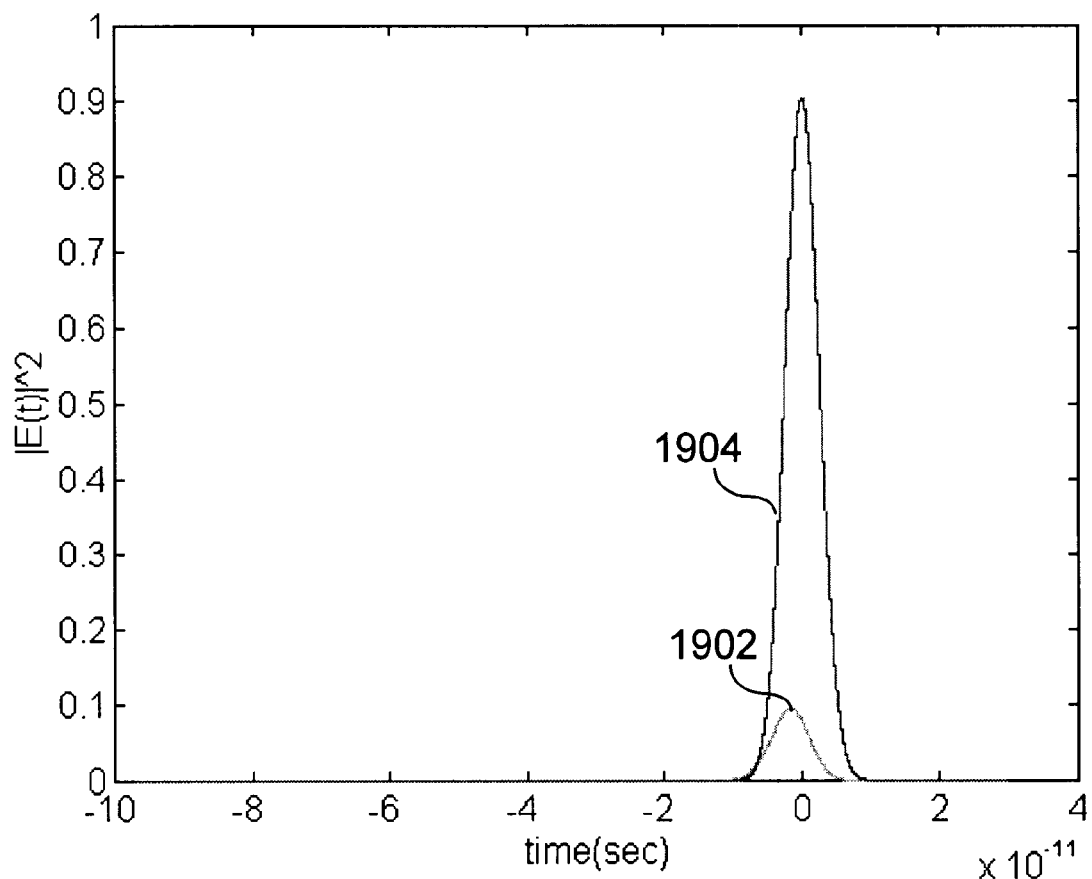

FIG. 19 is a plot illustrating the delay of a 5 ps input pulse without the addition of a gain material to the Bouche structure. This plot includes a transmitted pulse 1902 and a reflected pulse 1904. As indicated in FIG. 19, the delay obtained is less than in FIG. 18.

Accordingly, the present invention includes a method of imparting a delay to an input photonic signal of a predetermined frequency and a predetermined bandwidth. In one embodiment, the semiconductor structure is a photonic band gap structure having a defect layer doped with a gain medium, such as structure 900. In a further embodiment, the semiconductor structure is a VCESL, as illustrated is FIGS. 11 and 12. In other embodiments, the structure can be a structure that exhibits a photonic band gap structure.

This method includes the steps of sending the input photonic signal along an optical path; passing the photonic signal through a first region of periodically alternating refractive sections in said optical path of the photonic signal; passing the photonic signal through a periodicity defect region in said optical path, where the defect region is doped with a gain medium and excited by an energy source; and passing the photonic signal through a second region of periodically alternating refractive sections in said optical path. The energy source can be electrical current, a second photonic signal such as a continuous wave signal having the same frequency as the input photonic signal, mechanical energy such as force and/or pressure, and/or thermal energy.

6. Conclusion

Thus, the invention recognizes that the group velocity of the probe pulse can be controlled by adjusting the gain or absorption present in a photonic band gap structure. When gain is dominant, such as when an input pulse is tuned to the low frequency band edge resonance, the pulse group velocity decreases. When loss is present, such as when an input pulse is tuned to the high frequency band edge resonance, the group velocity of the pulse increases.

Embodiments of the present invention can include any number of periodic stacks and periodicity defect regions. In such embodiments, periodic stacks can be doped with gain media. Also, in embodiments including multiple periodicity defect regions, any number of them can be doped with a gain medium in any combination.

While various embodiments of the present invention have been described above, it should be understood that they have been presented by way of example only, and not limitation.

It will be understood by those skilled in the art that various changes in form and details may be made therein without departing from the spirit and scope of the invention as defined in the appended claims. Thus, the breadth and scope of the present invention should not be limited by any of the is above-described exemplary embodiments, but should be defined only in accordance with the following claims and their equivalents.

What is claimed is:

1. A device for delaying a photonic signal by a predetermined delay, the photonic signal having a predetermined frequency and a predetermined bandwidth, comprising:

a first region having periodically alternating refractive material layers which exhibit a photonic band gap structure, said first region comprising a first refractive material layer having a first thickness and a first index of refraction, and a second refractive material layer having a second thickness and a second index of refraction;

a second region having periodically alternating refractive material layers which exhibit a photonic band gap structure, said second region comprising a third refractive material layer having a third thickness and a third index of refraction, and a fourth refractive material layer having a fourth thickness and a fourth index of refraction; and a periodicity defect region, interposed between said first and second regions of periodically alternating refractive material layers, wherein said periodicity defect region is doped with a gain medium;

wherein the first predetermined delay is imparted to the photonic signal during passage through the device when said periodicity defect region is excited by an energy source.

2. The device of claim 1, wherein said energy source is an electrical current.

3. The device of claim 1, wherein said energy source is an optical signal having the predetermined frequency.

4. A method of imparting a delay to a photonic signal of a predetermined frequency and a predetermined bandwidth by a predetermined temporal duration, wherein the photonic signal is generated by an optical source, comprising the steps of:

sending the photonic signal along an optical path;

passing the photonic signal through a first region of periodically alternating refractive sections in said optical path of the photonic signal;

passing the photonic signal through a periodicity defect region in said optical path, wherein the periodicity defect region is doped with a gain medium and excited by an energy source; and passing the photonic signal through a second region of periodically alternating refractive sections in said optical path.

5. The method of claim 4, wherein the energy source is an electrical current; and further comprising the step of setting the electrical current to impart the desired delay.

6. The method of claim 4, wherein the energy source is an optical signal having the predetermined frequency; and further comprising the step of setting the optical signal to impart the desired delay.

* * * * *